United States Patent [19]
Fujiwara et al.

[11] Patent Number: 5,958,809
[45] Date of Patent: Sep. 28, 1999

[54] FLUORINE-CONTAINING SILICA GLASS

[75] Inventors: Seishi Fujiwara, Sagamihara; Hiroyuki Hiraiwa, Yokohama; Kazuhiro Nakagawa, Hachioji; Shouji Yajima; Norio Komine, both of Sagamihara; Hiroki Jinbo, Kawasaki, all of Japan

[73] Assignee: Nikon Corporation, Tokyo, Japan

[21] Appl. No.: 08/915,562

[22] Filed: Aug. 21, 1997

[30] Foreign Application Priority Data

Aug. 21, 1996 [JP] Japan .................... 8-218991
Aug. 22, 1996 [JP] Japan .................... 8-221248
Aug. 22, 1996 [JP] Japan .................... 8-881254

[51] Int. Cl.$^6$ ............... C03C 3/06; C03C 13/04
[52] U.S. Cl. ................... 501/54; 501/37; 501/57; 501/905
[58] Field of Search ................. 501/37, 54, 57, 501/905

[56] References Cited

U.S. PATENT DOCUMENTS

| | | | |
|---|---|---|---|
| 5,086,352 | 2/1992 | Yamagata et al. | 359/350 |
| 5,325,230 | 6/1994 | Yamagata et al. | 359/350 |
| 5,326,729 | 7/1994 | Yaba et al. | 501/54 |
| 5,679,125 | 10/1997 | Hiraiwa et al. | 65/397 |

FOREIGN PATENT DOCUMENTS

| | | |
|---|---|---|
| 0185106 A1 | 6/1986 | European Pat. Off. . |
| 0146659 B1 | 3/1988 | European Pat. Off. . |
| 0488320 A1 | 6/1992 | European Pat. Off. . |
| 0691312 A1 | 1/1996 | European Pat. Off. . |
| 0720969 A1 | 7/1996 | European Pat. Off. . |
| 0720970 A1 | 7/1996 | European Pat. Off. . |
| 1-201664 | 8/1989 | Japan . |
| 3-109233 | 5/1991 | Japan . |
| 5-211217 | 8/1993 | Japan . |
| 07291635 | 7/1995 | Japan . |
| 8-67530 | 3/1996 | Japan . |
| 8-75901 | 3/1996 | Japan . |

*Primary Examiner*—Karl Group
*Attorney, Agent, or Firm*—Morgan, Lewis & Bockius LLP

[57] ABSTRACT

The invention relates to fluorine-containing silica glasses, and methods of their production. The silica glass may be used for an ultraviolet light optical system in which light in a wavelength region of 200 nm or less, such as an ArF (193 nm) excimer laser, is used. The invention also relates to a projection exposure apparatus containing fluorine-containing glass of the invention.

7 Claims, 9 Drawing Sheets

FLUORINE-CONTAINING SILICA GLASS

This application claims benefit under 35 U.S.C. §119 of Japanese Patent Application No. 08-218991, filed Aug. 21, 1996, Japanese Patent Application No. 08-221248, filed Aug. 22, 1996 and Japanese Patent No. 08-221254, filed Aug. 22, 1996. These Japanese Patent Applications are hereby incorporated by reference.

FIELD OF THE INVENTION

The invention relates generally to fluorine-containing silica glasses, and methods of their production. The silica glass may be used for an ultraviolet light optical system in which light in a wavelength region of 200 nm or less, such as an ArF (193 nm) excimer laser, is used. The invention also relates to a projection exposure apparatus containing fluorine-containing glass of the invention.

BACKGROUND OF THE INVENTION

A reduction projection type exposure apparatus known as a stepper is used in photolithographic techniques in which fine patterns of integrated circuits are exposed and transferred onto wafers such as those made of silicon. A stepper optical system contains an illumination optical system and a projection optical system. The illumination optical system illuminates light from a light source uniformly onto a reticle on which an integrated circuit pattern is drawn. The projection optical system projects and transfer the integrated circuit pattern of the reticle onto the wafer, typically by reducing the circuit patterns projection to one fifth its original size. These stepper optical systems are widely used in large scale integration (LSI) and very large scale integration (VLSI) photolithography operations.

In recent years, large scale integration (LSI) and, more recently, very large scale integration (VLSI) have rapidly become more highly integrated and functionalized. In the field of logical VLSI, larger systems are being required with the shift to system-on-chip. With this progress, finer processability and higher integration capabilities are required for a wafer, such as that made of silicon, which constitutes a substrate for VLSI. Indeed, the advance from LSI to VLSI has gradually increased the capacity of DRAM from 1 KB through 256 KB, 1 MB, and 4 MB, with the corresponding processing line width required for the stepper becoming increasingly finer from 10 $\mu$m through 2 $\mu$m, 1 $\mu$m, 0.8 $\mu$m and 0.3 $\mu$m. Accordingly, it is necessary for a projection lens of the stepper to have a high resolution and a great depth of focus.

The resolution and the depth of focus of an optical lens is determined by the wavelength of the light used for exposure and the numerical aperture (N.A.) of the lens. The resolution and the depth of focus are expressed by the following equations:

resolution=$k1 \times \lambda$/N.A.

depth of focus=$k2 \times \lambda$/N.A.$^2$ where k1 and k2 are constants of proportionality. The resolution of the transfer pattern is proportional to the number of apertures of the projection optical lens system and is inversely proportional to the wavelength of the light from the light source. Thus, higher resolutions may be obtained by either increasing the numerical aperture or making the wavelength shorter.

From a practical standpoint, it is desirable to use a shorter wavelength of light to produce higher resolutions of transfer patterns. When the numerical aperture of the lens is increased, the angle of the refracted light is also increased preventing the capture of the refracted light. In contrast, when the exposure wavelength $\lambda$ becomes shorter, the angle of the refracted light becomes smaller in the same pattern, thereby allowing the numerical apperature to remain small. Furthermore, the number of apertures of the lens is limited by the lens production process, hence shortening of the wavelength is the only way to increase the resolution.

In order to achieve higher resolution of the transfer patterns, the wavelength of light sources used in a stepper is becoming shorter, going from g-line (436 nm) to I-line (365 nm) and further to KrF excimer laser beam (248 nm) and ArF excimer laser beam (193 nm). Indeed, as mentioned above, production of VLSI such as DRAM with storage capacity of more 4 MB requires the line-and-space, an index for stepper resolution, to be no more than 0.3 $\mu$m. This high degree of resolution, requires the use of ultraviolet and vacuum ultraviolet wavelengths of no more than 250 nm such as those achieved with an excimer laser light source.

A stepper typically contains a combination of numerous optical members such as lenses. Unfortunately, even when each lens element in the stepper has a small transmission loss, such a loss is multiplied by the number of the lens sheets used. Accordingly, it is necessary for the optical member to have a high transmittance. However, large light transmission losses occur when using a wavelength which is shorter than the I-line. Indeed, light in the wavelength region below 250 nm ceases to transmit through most optical glass materials. Only crystalline materials or silica glasses have proven to have sufficient light transmission properties for use as optical members in excimer laser light source steppers. Among these, silica glass is widely used not only for an excimer laser stepper but also for an optical system using general ultraviolet and vacuum ultraviolet light.

Silica glasses used as optical members in photolithography apparatus are required to meet exacting specifications. Indeed, high uniformity of the refractive index distribution is required in order to reduce the amount of multiple refraction, or to reduce inner strain (birefringence) of the optical member. For example, a refractive index distribution is required to be of an order of no more than $10^{-6}$ in an apperature having a diameter of 200 nm. Furthermore, a high transmission for the silica glass is also required. Typically, lenses having large curvatures are needed for aberration correction in projection optical systems, often causing the total optical path length in the projection optical system to exceed 1000 mm. In order to maintain the throughput of such a projection optical system at 80% or more, an internal transmittance per 1 cm of the optical member needs to be 99.8% or higher, i.e., no more than 0.002 cm$^{-1}$ converted in terms of inner absorption coefficient. Moreover, such a high transmittance is required to be maintained over the entire area of the optical member. For these reasons, only high purity silica glasses may be used in a optical system such as an excimer laser stepper. Thus, a need exists for silica glasses capable of being used in these optical systems.

Synthetic silica glasses are roughly classified according to production method into synthetic silica glass and fused silica glass. The production of synthetic silica glass is further classified mainly into the Vapor Phase Axial Deposition (VAD) method, which is also known as the soot re-melting method; the direct method, which is also known as the flame hydrolysis method; and the plasma method. All of these synthetic methods belong to a general manufacturing category known as a gas phase synthetic method.

In the Vapor Phase Axial Deposition (VAD) method, a high purity gaseous silicon compound is hydrolyzed in an oxygen/hydrogen flame, and deposits soot on a target. This result in a soot ingot, which is sintered at 800° C. and consolidated by heating the soot ingot at a relatively low temperature of 1600° C. while performing a dehydration process with chlorine gas. A silica glass ingot is then obtained.

In the direct method (flame hydrolysis method), a high purity gaseous silicon compound, such as silicon tetrachloride, is hydrolyzed in an oxygen and hydrogen flame to form minute silica glass particles (soot particles). The gaseous silicon compound, oxygen and hydrogen are expelled from a burner. A silica glass ingot is obtained by depositing to soot particles on a target, melting the soot particles to form glass particles, in a single step, while the target is being rotated, rocked and/or lowered in the direction of the burner. Using a direct method, an attempt has been made to obtain an even more uniform silica glass by performing a secondary heat treatment of about 2000° C. on the silica glass optical member which is obtained by the direct method. In that method, the subsequent heat treatment is termed "secondary" as opposed to the process of synthesizing the silica glass which is the first process.

In the plasma method, a high purity, gaseous silicon compound is oxidized in a high frequency plasma flame of oxygen and argon to form the soot. A silica glass lump is obtained by depositing the soot onto a target, melting it, and making it transparent, all at once, while the target is being rotated and lowered in the direction of the burner. In general, synthetic silica glasses are obtained by using a VAD method or direct method rather than a plasma method.

Using such gas phase methods, it is possible to obtain a silica glass optical member with higher purity, higher light transmittance for wavelengths below 250 nm, larger aperture diameter, and more uniformity than obtained from fused silica glass. Fused silica glass is obtained by electric or flame melting of a natural quartz powder. For these reasons, a synthetic silica glass is viewed as a promising material for a photolithography apparatus optical system such as an excimer laser stepper.

However, the synthetic silica glasses described above are susceptible to degradation when exposed to ultraviolet light typically used in a stepper. When synthetic silica glass is exposed for a long period of time to high output ultraviolet light or excimer laser beam an absorption band of 215 nm often appears due to a structural defect known as E'-center. In addition, an absorption band of 260 nm caused by a structural defect known as NBOHC (Non-Bridging Oxygen Hole Center), may also appear. The presence of either absorption band results in a rapid transmission loss in the ultraviolet wavelength region. An E'-center represents a structure of $\equiv$Si•, in which $\equiv$ indicates bonding with three oxygen atoms rather than a triple bond and • indicates unpaired electron. An NBOHC is a structure corresponding to $\equiv$Si—O•. These structural defects result in transmission losses in the ultraviolet wavelength region and render a synthetic silica glass unsuitable for use with an ultraviolet light or excimer laser.

Examples of precursors which generate structural defects include a $\equiv$Si—Si$\equiv$, a $\equiv$Si—O—O—Si$\equiv$, and Cl. Silica glasses produced by the plasma method or by the VAD method are known to contain such precursors. However, absorption measurements using vacuum ultraviolet, ultraviolet, visible light and infra-red spectrometer have verified that an imperfect structure due to an oxygen deficiency or an excess of oxygen generally does not occur in synthetic silica glass produced by the direct method. Moreover, using a direct method a synthetic silica glass, a high degree of purity may be obtained with the concentration of metal impurities, such as, Mg, Ca, Ti, Cr, Fe, Ni, Cu, Zn, Co, Mn, being less than 20 ppb. Consequently, a synthetic silica glass obtained by the direct method is generally considered a promising optical member for use in excimer laser stepper. Unfortunately, synthetic silica glass produced by a direct method of the prior art often undergoes a reduction in transmittance due to the presence of unidentified precursors in the final glass.

Attempts to prevent the reduction in transmittance of a synthetic silica glass have been made. One such attempt is described in Japanese Laid-Open Patent Publication 1-201664, incorporated herein by reference, which teaches heat treating the silica glass in a hydrogen atmosphere. Another technique is described in Japanese Laid-Open Patent Publication 3-109233, incorporated herein by reference, which teaches hydrogen molecule doping. However, doping silica glass with hydrogen molecules repairs, but does not eliminate, structural defects caused by irradiation of ultraviolet light. For example, hydrogen molecules react with an E' center and are transformed to $\equiv$Si—H bonds, helping to reduce the E' center concentration. However, $\equiv$Si—H is rapidly transformed back to an E' center defect upon further irradiation with ultraviolet light. It is important to prevent generation of structural defects such as an E' center or NBOHC by eliminating or reducing the amount of materials which cause these structural defects.

Attempts have also been made to control the generation of structural defects such as E' center or NBOHC by reducing or excluding the presence of Cl in a synthetic silica glass. By doing this, precursors related to Cl are reduced or excluded with a certain degree of control against excimer laser or ultraviolet light irradiation defects being achieved. However, although conventional techniques, such as those described above, have shown some degree of success, often these techniques failed to reduce degradation of silica glass when using an excimer laser stepper. The invention described below aims to solve the shortcoming of conventional techniques described by providing a synthetic silica glass optical member which controls the generation of ultraviolet light defects and prevents a decline in transmittance even when the subjecting silica glass optical member to ultraviolet light and excimer laser beam of short wavelength and of high output for long durations.

Another approach to preventing the formation of structural defects has been to add fluorine to the silica glass via a VAD method. In contrast to Si—Si bonds, Si—F bonds have a large bonding energy and are not rapidly dissociated by ultraviolet light. A method of manufacturing a silica glass containing fluorine, hydroxyl group and hydrogen molecules by the VAD method is described in Japanese Laid-Open Patent Publications 8-67530 and 8-7590, incorporated herein by reference. The references disclose that by doping the silica glass with fluorine to form Si—F bonds, the number of Si—Si bonds, which are oxygen deficient type defects causing an absorption of light at 163 nm, may be reduced. Indeed, in Japanese Laid-Open Patent Publication 6-156302, incorporated herein by reference, it was discovered that some silica glasses formed by a VAD method in which fluorine concentration is no less than 100 ppm were effective as vacuum ultraviolet-use optical members. However, some silica glasses containing 100 ppm formed by the VAD method were found to generate an emission band having a peak wavelength of 585 nm and suffered a decreased initial transmittance at wavelengths below 250 nm. Thus, silica glass formed by previous VAD methods have not proven satisfactory for photolithography techniques requiring the use of ultraviolet light less than or equal to 250 nm.

The VAD method generally requires secondary processing such as heat processing in a hydrogen atmosphere. Without such heat treatment it was impossible to have fluorine, hydroxyl group and hydrogen molecules present at the same time in the silica glass. However, problems also arise during this heat treatment. The silica glass may become contaminated with impurities resulting in ultraviolet light transmission losses. Also, hydrogen diffuses into the interior of the glass substrate. This diffusion creates a non-uniform distribution of the hydrogen in the silica glass with a higher hydrogen molecules concentration occurring at the edges of the glass as compared to the center of the glass. This effect is exacerbated as the diameter of the glass increases. Thus, sufficient silica glass resistance to ultraviolet light degradation is not obtained when using previous VAD methods.

Previous attempts at fluorine doping of silica glass have been performed using the VAD method. This is because the use of the direct method with its oxygen/hydrogen flame causes fluorine contained in a dopant gas to react with hydrogen contained in oxygen/hydrogen flame to form hydrofluoric acid which is expelled out of the system. In other words, fluorine and hydroxyl groups cannot co-exist at high temperature. This can be seen from a free energy point of view because the Gibbs free energy sign for the reaction of fluorine and hydroxyl group reverses around 1200 K. Therefore, fluoride doping using a direct method performed at a high temperature of 2000 K or more will cause hydroxyl group and fluorine to react, preventing fluorine doping of the silica glass.

Even with such attempts, there remains a need to produce high quality synthetic silica glass which may be used in optical devices, such as steppers. Moreover, there remains a need for synthetic silica glasses which may be used with ultraviolet (UV) light and excimer laser beam but which resist forming defects associated with that use.

SUMMARY OF THE INVENTION

The invention answers these needs, particularly the problems of using ultraviolet light lasers with silica glasses, by providing fluorine-containing silica glasses which have excellent resistance to degradation and structural defects when exposed to ultraviolet light while providing superior ultraviolet light transmittance. The invention also provides various cost effective methods of manufacturing fluorine-containing silica glasses.

A first embodiment of the invention relates to an optical, fluorine-containing silica glass preferably produced by a direct method using a fluorine-containing gas. The optical fluorine-containing silica glass having a weight ratio of fluorine to sulfur of no less than 100. By having a sufficiently high weight ratio of fluorine to sulfur in the silica glass it is possible to achieve transmittance of 99.9% or higher for ultraviolet light of wavelength 193 nm. The fluorine concentration in silica glasses formed by this method is generally 100 ppm or higher. Throughout the specification, "transmittance" represents a bulk transmittance (transmittance of the interior of the glass) which excludes effects of reflection and scattering at the surface of the glass.

A second embodiment of the invention relates to a direct method of producing a fluorine-containing silica glass. The method hydrolyzes a silicon-containing gas in a oxygen/hydrogen flame and in the presence of a fluorine-containing gas to form a fluorine-containing, silica glass powder, and allowing the glass powder to accumulate on a target and melt to form a fluorine-containing silica glass. The silicon-containing gas, the fluorine-containing gas, a carrier gas, and a combustion gas are expelled through a burner having a circular center pipe and at least one concentric circular ring pipe surrounding the center pipe. The silicon-containing gas is expelled through the center pipe and the fluorine-containing gas is expelled through the center pipe or a ring pipe adjacent to the center pipe. Silica glass manufactured by this method contains fluorine, hydrogen molecules and hydroxyl group. A preferred concentration range for the fluorine in the silica glass ranges from about 50 to 1000 ppm.

In a third embodiment of the invention a fluorine-containing silica glass is manufactured by direct method such that it is substantially free of chlorine and has a structure determination temperature ranging from 900 K to 1200 K.

The fluorine-containing silica glasses made by the above embodiments may be used in a projection exposure apparatus, which projects and exposes a pattern image of a mask onto a substrate using ultraviolet light. The projection exposure apparatus contains an illumination optical system for illuminating the mask using ultraviolet light as exposure light and a projection optical system for forming the pattern image of mask on a substrate. The projection exposure apparatus of the invention includes an optical member made of a fluorine-containing silica glass. The fluorine-containing silica glass may be contained in either the illumination optical system or the projection optical system or both.

The silica glasses of the invention has higher durability as well as higher transmittance against the ultraviolet light thanks to the effects of fluorine, hydrogen molecules and hydroxyl group which are contained in the silica glass. Such silica glasses have a longer life than conventional exposure apparatus.

Other advantages and features of the invention will be apparent from consideration of the detailed description of the invention provided below.

DETAILED DESCRIPTION OF THE INVENTION

The invention provides a commercially feasible method of forming a fluorine-containing silica glass which may be used in a photolithography apparatus. Silica glasses of the invention exhibit a high degree of ultraviolet light transmittance and are better able to withstand degradation when exposed to ultraviolet light of wavelengths of less than 250 nm than conventional silica glasses. The fluorine-containing silica glasses can be formed with large diameters and are usable in the vacuum ultraviolet region without absorption of ultraviolet light in the vacuum ultraviolet light region of from 160 nm to 250 nm. Preferably, the silica glasses of the invention may be used as optical devices in photolithography devices such as a stepper.

High UV Transmission Fluorine-containing Silica Glass

Figure 2:
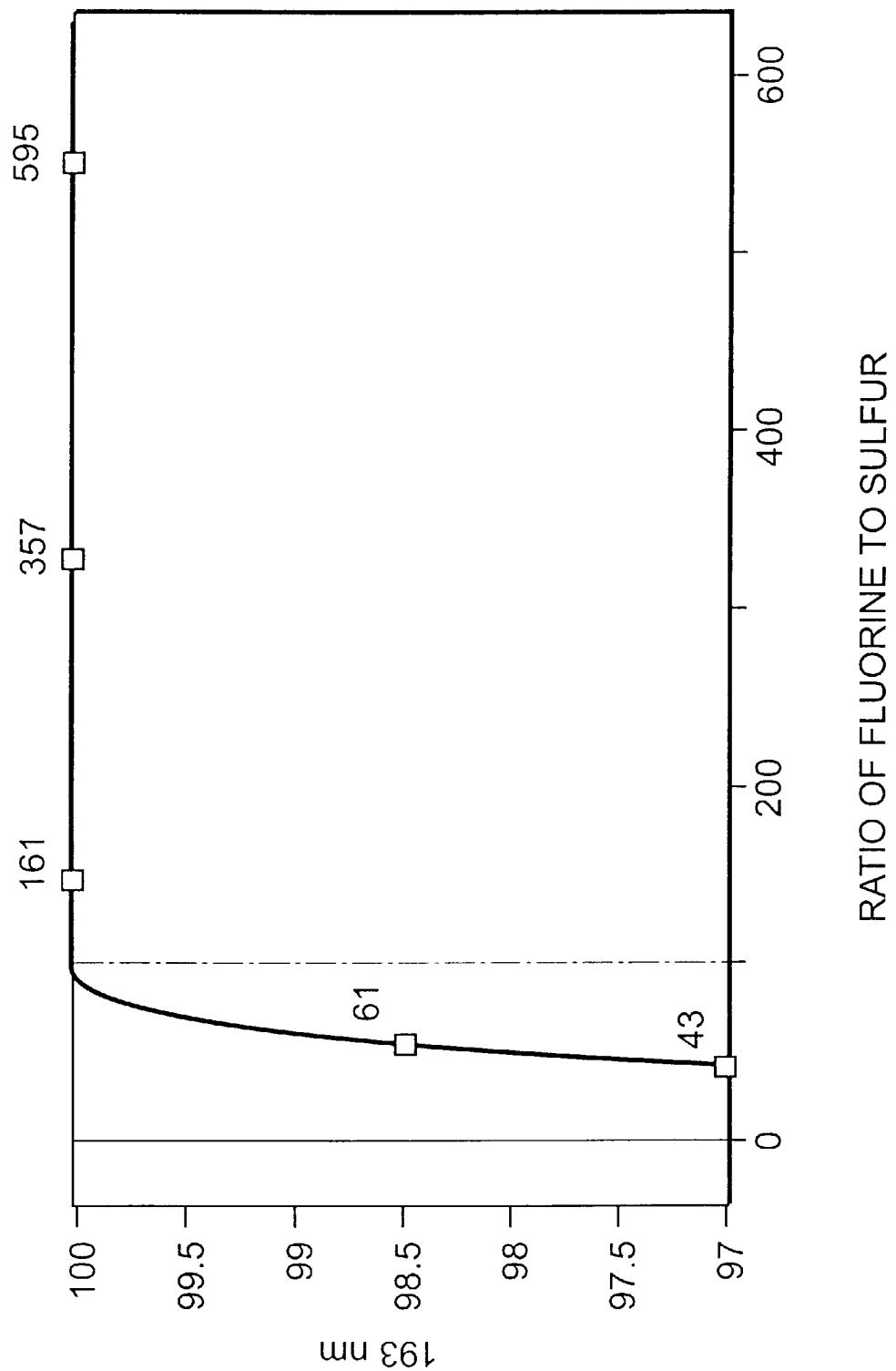
FIG. 2 is graph depicting the correlation between the fluorine-sulfur ratio and the initial transmittance.

A first embodiment of the invention provides an optical, fluorine-containing silica glass produced by a direct method using a fluorine-containing gas. Optical, fluorine-containing silica glasses according to this embodiment have high UV transmittance particularly below 230 nm and do not suffer from the defects caused by UV light as do prior silica glasses. The optical, fluorine-containing silica glass has a weight ratio of fluorine to sulfur of no less than 100. Preferably, the optical, fluorine-containing silica glass has a transmittance of 99.9% or higher for ultraviolet light of wavelength 193 nm. FIG. 2 depicts the correlation between the fluorine-sulfur weight ratio and transmittance at 193 nm. An optical, fluorine-containing silica glass of this embodiment also preferably has fluorine concentration of no less than 100 ppm.

In general, the fluorine-containing silica glass may be made by a direct method, and is preferably made by the direct method described below. When using sulfur hexafluoride as the fluorine-containing gas, a large number of sulfur atoms may be introduced into the fluorine-containing silica glass. Sulfur atoms, which are often used as emission elements, can cause light emissions in conventional silica glasses causing them to be unsuitable for use. Indeed, if the weight ratio of sulfur to fluorine in the silica glass is below 100, a decreased initial transmittance and an emission band with strong yellow light having a peak wavelength of 585 mn is observed. The reason for this phenomena is not clear, however, it is believed that the sulfur contained is the glass may act in a manner similar to alkaline metals, such as sodium, and may cause generation of non-bridge oxygen NBO defect. Such a non-bridge oxygen defect possesses an absorption around 185 nm resulting in poor transmittance of ultraviolet light. However, the non-bridge oxygen defect generated by the presence of the sulfur atoms is terminated by fluorine. If the silica glass has a small fluorine concentration, the non-bridge oxygen defect generated by the sulfur may remain.

It has been discovered that a high transmittance in the ultraviolet region below 250 nm is obtained when the weight ratio of fluorine to sulfur is 100:1 or above. Accordingly, an optical fluorine-containing silica glass of the invention has a molar ratio of fluorine to sulfur of no less than 100. When the weight ratio is no less than 100, a transmittance of 99.9% or higher for ultraviolet light of wavelength 193 nm may also be obtained. Preferably, the amount of fluorine contained in an optical, fluorine-containing silica glass of the invention is also 100 ppm or higher. In this way, optical fluorine-containing silica glasses of the invention have high transmittance in the ultraviolet region below 250 nm and advantageously have properties which resist defects caused by UV light, e.g., NBOHC. Such silica glasses are particularly useful in precision optical equipment, such as a stepper.

Direct Method

In a second embodiment of the invention, a fluorine-containing silica glass is manufactured by a direct method. The method hydrolyzes a silicon-containing gas in a flame, preferably a hydrogen/oxygen flame, and in the presence of a fluorine-containing gas to form a fluorine-containing, silica glass powder, and allows the glass powder to accumulate on a target and melt to form a fluorine-containing silica glass. In the method, the silicon-containing gas, the fluorine-containing gas, a carrier gas, and a combustion gas are expelled through a burner having a circular center pipe and at least one concentric circular ring pipe surrounding the center pipe. The silicon-containing gas is expelled through the center pipe and the fluorine-containing gas is expelled through the center pipe or a ring pipe adjacent to the center pipe.

The flame hydrolysis progresses such that the silicon-containing gas and the fluorine-containing gas are well mixed (the silicon-containing gas and the fluorine-containing gas may be the same gas, e.g., a gas having Si—F bonds) and the production of the fluorine-containing silica glass in the reaction zone is not governed by free energy considerations. Accordingly, the invention provides a method of producing a fluorine-containing silica glass in which the silicon-containing gas, a carrier gas, and a combustion gas are expelled from a burner which also expels the fluorine-containing gas.

Figure 3:
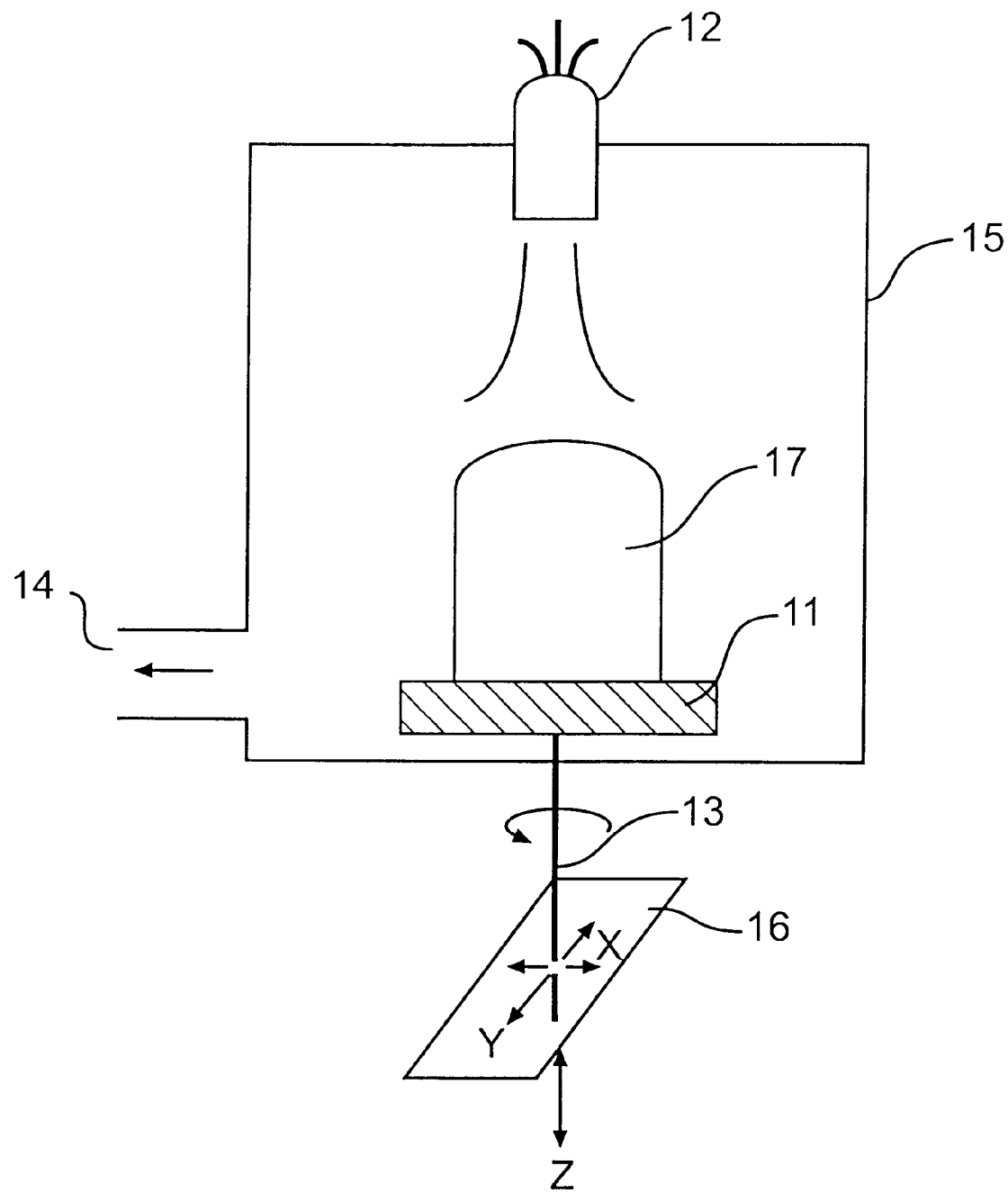
FIG. 3 is a simplified partial diagram of a synthetic furnace of the invention.

A preferred direct method expels the flammable gas, the carrier gas, the silicon-containing gas and the fluorine-containing gas from a burner having four ring pipes arranged in a concentric circle around a center pipe. This type of burner is shown in FIG. 3 and is discussed in Example 4, below. The silicon-containing gas is expelled from the center pipe. The fluorine-containing gas may be expelled from either the center pipe, the first ring pipe adjacent to the center pipe, or both. Preferably, the fluorine-containing gas is expelled from the center pipe. In a more preferred method, the fluorine-containing gas is also expelled both from the center pipe and from the first concentric ring pipe adjacent to the center pipe. By doing so, large amounts of fluorine can be doped into the silica glass. The glasses produced by these methods contain fluorine, hydrogen molecules and hydroxide ions. The resulting silica glasses exhibit excellent durability against degradation by ultraviolet light and virtually no decline in transmittance when subjected to irradiation with high output excimer laser beam or ultraviolet light for long periods of time.

As discussed below, a direct flame hydrolysis method of the invention, produces a fluorine-containing having a hydroxyl group and hydrogen molecule concentration of more than 100 ppm and $1\times10^{17}$ molecules/cm$^3$ respectively are obtained. Generally, the hydrogen molecule concentration in the silica glass ranges from about $1\times10^{17}$ to $5\times10^{18}$, preferably from about $2\times10^{17}$ to $5\times10^{18}$ molecules/cm$^3$. The fluorine concentration in the glass is more than or equal to 0.01 weight percent but less than or equal of 0.5 weight percent. However, if the amount of fluorine doping is too large, the fluorine may exist in the glass as Si—F in addition to as fluorine molecules, causing absorption by fluorine molecules in ultraviolet region. This results in poor initial transmission loss. Moreover, fluorine molecules are dissociated by ultraviolet light irradiation, which may have detrimental effects on the silica glass decreasing its resistance against ultraviolet light.

Figure 5:
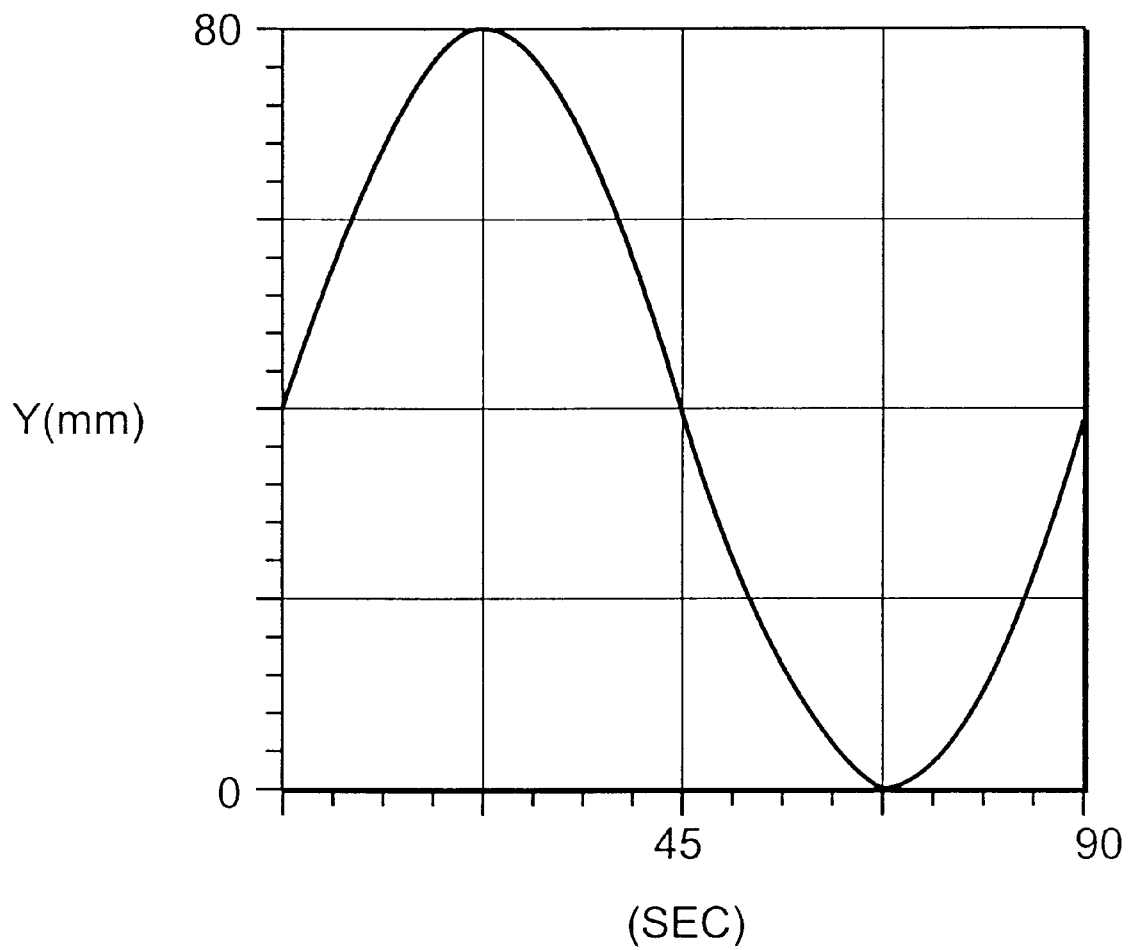
FIG. 5 is a diagram depicting a movement pattern of the stage unit of the target.

Preferably, the fluoride is evenly distributed throughout the silica glass. An even distribution of fluoride results in a silica glass with a large diameter and a high level of uniformity of refractive index in the radial direction. To do this, the temperature on the surface of the glass ingot, formed by the deposition of minute glass particles on the target should be constant and uniform. Additionally, to improve the uniformity of the silica glass, it is preferred that the relative position of the target is moved in a plane with respect to the burner. Furthermore, it is preferred that the movement pattern creates a uniform residence time of silicon-containing gas relative to the silica glass ingot surface. The moving body may be either the target or the burner, but from a maneuverability point of view, it is easier to move the target relative to the burner. A suitable movement pattern of the stage unit of the target is shown in FIG. 5. Such movement patterns allow the fluorine in the gaseous mixture to be diffused uniformly in the glass such that a high level of uniformity is obtained for the glass. By moving the target relative to the burner in this manner, a silica glass is formed such that the maximum value and the minimum value of the fluorine concentration distribution is no more than 15 ppm.

In another aspect of this method, the burner of the production apparatus may be placed at a certain angle with respect to the growth direction of the target. A preferred angle may range from 10 to 20°, and more preferably be about 15°. By placing the burner at an angle to the growth, it becomes possible to diffuse fluorine uniformly in the silica glass by rocking the target in the growth direction of the ingot. Preferably, the silica glass ingot is formed by simultaneously deposition, melting and making the silica glass particles transparent while rotating, rocking and lowering the target with respect to the burner.

In a direct method of the invention, a fluorine-containing silica glass is formed using a fluorine-containing gas, a silicon-containing gas, a carrier gas and a flammable gas. The fluorine-containing gas is selected from a group including, but not limited to, $SiF_4$, $SF_6$, $F_2$ or mixtures thereof. As mentioned above, if the fluorine doping amount is too large, fluorine will exist in the glass as both Si—F and as fluorine molecules, allowing absorption by fluorine molecules to occur in the ultraviolet region. This results in poor initial transmission loss. Since fluorine molecules are dissociated by ultraviolet light irradiation, the silica glass to degrade when exposed to ultraviolet light. Thus, the fluorine concentration in the silica glass is typically more than about 10 ppm and less than about 5000 ppm. A preferred concentration range is from about 50 ppm to 1000 ppm, more preferably about 100 ppm to 1000 ppm.

When a silica glass is synthesized using silicon tetrafluoride, it is desirable to make the fluorine concentration within a range from 50 to 1000 ppm. If the fluorine concentration is 1000 ppm or higher, it becomes difficult to control the maximum concentration difference of fluorine distribution in the radial direction to be less than about 10 ppm when a member with large diameter, for example, 200 mm or more, is required. In this case, the fluorine concentration difference is equivalent to about $4\times10^{-6}$ computed in terms of refractive index difference. Thus, it is desirable to maintain a fluorine concentration of 1000 ppm or less in order maintain the uniformity of the refractive index.

The silicon-containing gas is selected from a group including, but not limited to, $SiF_4$, $SiCl_4$, $SiH_nCl_{4-n}$ (n=1—4), an organic silicon compound, or mixtures of such gases. Preferably, the flow amount of $SiCl_4$ ranges from about 0 g/m to 5 g/min. The fluorine-containing gas and the silicon-containing gas may be $SiF_4$. Preferably the silicon-containing gas is a mixture having of $SiCl_4$ and $SiF_4$, and the fluorine-containing gas is $SiF_4$. Preferably, the ratio of $SiCl_4$ to $SiF_4$ ranges from 0 to 0.25. The mixture of $SiCl_4$ and $SiF_4$ may be expelled from the circular pipe. By mixing $SiF_4$ and $SiCl_4$, the chlorine contained in the flame is also able to control the etching effect of the fluorine, contained in the flame, on the glass surface. The use of such a mixture increases the $SiO_2$ layer amount per unit time and increases the probability of fluorine remaining in the silica glass. Moreover, by mixing $SiCl_4$, the corrosion of the exhaust system and other parts due to hydrofluoric acid generated by $SiF_4$ is reduced. Moreover, $SiF_4$ is a relatively expensive gas, and thus, its use increases the manufacturing costs of the silica glass. Consequently, substantially reduced manufacturing costs are achieved by mixing $SiCl_4$ with $SiF_4$.

Any carrier gas typically used in a direct flame hydrolysis may also be used in the methods of this invention. Typical carrier gases, include, but not limited to, He, $O_2$, $F_2$, $SF_6$, or mixtures thereof. If sulfur hexafluoride ($SF_6$) is used as the carrier gas, it should preferably be mixed with oxygen gas in order to reduce the amount of sulfur contained in the glass. Preferably, the carrier gas is He or $O_2$, most preferably $O_2$. It is desirable to expel the carrier gas from the ring pipe adjacent to the circular pipe. This has an effect of preventing the surrounding hydrogen gas and fluorine-containing gas from forming hydrofluoric acid and escaping the system. Moreover, either a mixture of oxygen gas and a gas containing fluorine atom in its molecule or a gas containing only fluorine may be used as carrier gas when silicon-containing gas is expelled from the circular pipe. However, if the gas containing only fluorine is used as a carrier, a temperature of the synthesis surface of the ingot tends to fall slightly, causing synthesis to be difficult. Hence, the mixture of an oxygen gas and the gas containing fluorine atom in its molecule is preferred.

The hydroxyl group concentration in the silica glass (which exist as Si—OH groups) ranges from about 600 ppm to 1300 ppm. The presence of hydroxyl group provides a more stable silica glass as it eliminates bridging over unstable bonding angles of ≡Si—O—Si≡. The desired hydroxyl group concentration in the silica glass may be obtained by controlling the ratio of oxygen and hydrogen in the flame to be in the range of $0.2 \leq O_2/H_2 \leq 0.5$. This ratio of oxygen and hydrogen optimizes the hydroxyl group concentration and diffuses hydrogen molecules into the silica glass. The presence of hydrogen molecules terminates defects generated by ultraviolet light irradiation resulting in improved silica glass durability against ultraviolet light. By making the ratio of oxygen and hydrogen to be less than the stoichiometric ratio of 0.5 in the oxygen and hydrogen flame, both hydroxyl group and hydrogen molecules may be optimized while at the same time, hydrogen molecule concentration may be made to be $2 \times 10^{17}$ molecules/cm³ or higher. Silica glass manufactured containing several 100 ppm or more hydroxyl groups is stable structurally.

To increase the amount of fluorine contained in the silica glass, the weight of oxygen may be made slightly higher in the ratio of carrier gas such as oxygen gas and combustible gas such as hydrogen gas which are burst from the burner during synthesis. In particular, a desirable ratio of oxygen to hydrogen in the gas to be burst from the entire burner is 0.50–0.70. More preferably, the oxygen gas may be expelled from the first ring pipe which is adjacent to the circular pipe. This prevents surrounding hydrogen gas and fluorine-containing gas from forming hydrofluoric acid and escaping completely outside the system. Moreover, synthesis under oxygen heavy condition reduces the water existing within the system, enabling control of generation speed of hydrofluoric acid which is also a decomposition generation product to be low. By increasing the ratio of $O_2$ to $H_2$, it becomes possible to increase the amount of fluorine contained in the silica glass.

Fluorine-containing Silica Glasses Having Substantially No Chlorine

One way to enhance the fundamental anti-ultraviolet light property of a fluorine-containing silica glass is to control the existence of structural defects in the glass itself. This would involve (1) stabilizing of the silica glass structure itself and (2) optimizing the amounts of hydroxyl groups, chlorine and fluorine contained in the silica glass. Silica glasses of this third embodiment possess enhanced anti-ultraviolet light properties because chlorine is substantially excluded from the silica glass and the silica glass has a structural determination temperature ranging from 900 to 1200 K. "Structural determination temperature is a parameter indicating the stabilization of the silica glass structure. Additionally, the silica glass preferably has a fluorine concentration ranging from 10 to 1000 ppm exhibit increased enhancement of their resistance to defects caused by ultraviolet light. In other preferred embodiments, the hydroxyl group concentration in the silica glass ranges from 600 to 1300 and the hydrogen molecule concentration ranges from $2 \times 10^{17}$ to $5 \times 10^{18}$ molecules/cm³.

Accordingly, another embodiment of the invention involves the manufacturing of fluorine-containing silica glasses having reduced amounts of chlorine. In manufacturing a silica glass using the direct method, silica tetrachloride ($SiCl_4$) is normally used as it is inexpensive, easy to handle and readily available. Consequently, several dozen ppm of chlorine typically remains in silica glasses manufactured by the direct method. As previously described, silica glass having lower levels of chlorine exhibits less degradation when subjected to ultraviolet light. Indeed, silica glass containing virtually no residual chlorine exhibits very little degradation when exposed to ultraviolet light.

A silica glass of this embodiment may be prepared by a direct flame hydrolysis method and is substantially free of chlorine. Preferably, the silica glass has a chlorine concentration of preferably 50 ppm or less and more preferably 10 ppm or less. As mentioned, the structure determination temperature of the silica glass ranges between 900 K and 1200 K.

A direct method of this invention may be used to obtain a silica glass, which is substantially free of chlorine. In the direct method, a silicon-containing gas, for example, silicon tetrafluoride ($SiF_4$), silicon tetrachloride or an alkoxy silane such as $Si(CH_3O)_4$, $Si(C_2H_5O)_4$ and $Si(CH_3)(OCH_3)_3$ substantially, if not entirely, replaces the $SiCl_4$ used in conventional direct method. However, use of the alkoxy silane as the silicon-containing gas for synthesis may form a carbon compound which remains in the silica glass. For this reason, it is preferable to use silicon tetrafluoride or silicon tetrachloride as the silicon-containing gas for forming the silica glass. In this manner, a silica glass, which is substantially free of chlorine, having a structure determination temperature ranging from 900 K. to 1200 K., and without any carbon related impure objects, may be formed.

Silica glasses having lower structure determination temperatures exhibit less degradation when subjected to ultraviolet light than those with higher structure determination temperature. As discussed in European Patent Application EPO 720969A1 and EPO 720970A1 (the entire disclosures of which are incorporated here by reference), the structure determination temperature indicates the structural stability of a silica glass. The fluctuation in density of a silica glass at room temperature, namely structural stability, is determined by the density of the silica glass in a state of melt at high temperature, and the density and structure of the silica glass when the density and the structure are frozen at around the glass transition point during cooling. That is, the thermodynamic density and structure corresponding to the temperature at which the density and structure are frozen are also retained at room temperature. The temperature when the density and structure are frozen is the structure determination temperature of the invention.

The structure determination temperature can be determined in the following manner. First a test piece of silica glass is retained at a plurality of temperatures within the range of 1073 K. to 1700 K. for a period of longer than the structure relaxation time, a time required for the structure of the silica glass being relaxed at that temperature. The glass is retained at the retention temperature in air in a tubular oven made of silica glass, thereby allowing the structure of the test piece to reach the structure at the retention temperature. As a result, the test piece has a structure which is in thermal equilibrium state at the retention temperature. Then, the test piece is placed, not into water, but into liquid nitrogen within 0.2 seconds to quench it. If the test piece is placed in water, quenching is insufficient and structural relaxation occurs such that the structure at the retention temperature differs from the final structure of the silica glass. Moreover, adverse effects may arise due to the reaction between water and the silica glass. Thus, by quenching the test piece in liquid nitrogen, the structure determination temperature coincides with the retention temperature structure.

The test pieces having various structure determination temperatures, equal to the retention temperature, are subjected to measurement of Raman scattering. A 606 cm$^{-1}$ line intensity is obtained as a ratio to 800 cm$^{-1}$ line intensity. From this data, a graph can be prepared with the structure determination temperature for the 606 cm$^{-1}$ line intensity used as a calibration curve. This is shown, for example, in FIG. 10. Thus, the structure determination temperature of a test piece may be calculated from the measured 606 cm$^{-1}$ line intensity using the calibration curve.

Silica glasses having lower structure determination temperatures exhibit less degradation when subjected to ultraviolet light than those with higher structure determination temperature. Previously, silica glasses were formed having a structure determination temperature of 1300 K. or higher. A silica glass formed by the direct method, i.e., hydrolysis of a silica compound, such as silica tetrachloride, in an oxygen and hydrogen flame to form minute glass particles, with the resulting glass particles deposited and melted on a target to produce a silica glass ingot, normally has a structure determination temperature of 1300 K. or higher. Also, a silica glass synthesized by the direct method, hydrolysis of a high purity silica compound in a hydrogen and oxygen flame to form glass particles with the particles being deposited on a target to produce a glass lump, which is made transparent by secondary process to obtain a silica glass lump, normally has a structure temperature of higher than 1300 K. because the secondary transparency process is performed generally in the temperature around 1700 K. Silica glass fibers have a structure determination temperature of about 1400 K. as the fiber drawing process is conducted at a temperature of about 1700 K.

Superior silica glass resistance to degradation caused by ultraviolet light is obtained for glasses having a structure determination temperature of less than 1200 K. Preferably the structure determination temperature ranges from about 900 K. to 1200 K. Silica glasses having the structure determination temperature of 1200 K. or below may be obtained by several different methods.

One method of achieving a structure determination temperature of below 1200 K. involves using a silica glass with the structure determination temperature 1300 K. or higher which is kept at a temperature of 1200 K. or lower until the structure reaches equilibrium at that temperature. For example, a structural relaxation time of a silica glass containing about 1000 ppm hydroxide ion at 1173 K. is expected to be about 1900 seconds. Thus, for such a silica glass the structure determination temperature is made 1173 K. by keeping the silica glass at that temperature for longer than 1900 seconds.

A second method of achieving a structure temperature of 1200 K. or less raises the temperature of a silica glass to about 1200 K. to 1400 K. until the structure reaches equilibrium, usually about ranging from about five hours to several dozen hours. Then, the silica glass is annealed by lowering the temperature to 1000 K. or less, preferably to 773 K. or less, annealing completion temperature, with a temperature lowering speed of 50 K./hour or less, preferably of 10 K./hour or less. This is referred to as the annealing speed or cooling speed. If the annealing temperature exceeds 1000 K., or if the annealing speed exceeds 50 K./hour, the structure determination temperature cannot be reduced below 1200 K., and structural distortion is not sufficiently removed. Once properly annealed the silica glass is normally left alone and allowed to cool to room temperature, although there is no special restriction after the silica glass reaches the aforementioned annealing completion temperature. Furthermore, in the production methods above, there is no special restriction on atmosphere or pressure. Thus, regular air may be used at atmospheric pressure.

Optical Devices

A synthetic fluorine-containing silica glass made by the method of the present invention may be used in any type of optical member, particularly optical members for use with ultraviolet light. There is no restriction on the type an optical member except that the optical member contains synthetic silica glass made by the above method. The silica glass may be used in various optical members such as lenses and prisms to be used for an exposure apparatus such as a stepper. Moreover, the possible optical members includes materials used to manufacture lenses, prisms and the like. Furthermore, conventional processing methods may be used to process the synthetic silica glass of the invention into to a desired optical member. For example, there are no specific restrictions and normal cutting and grinding methods may be used.

An optical member using a fluorine-containing silica glass of the invention has a longer life than conventional optical member because it is made of synthetic glass with a higher resistance and higher transmittance against ultraviolet light. This is due to the beneficial combination of properties from the fluorine, hydrogen molecules and hydroxyl groups contained in the silica glass prepared according to the invention.

The silica glasses of the invention may be used in any optical device. The silica glasses can be used in many ways including, but not limited to a lens member, a fiber, a window member, a mirror, an etalon and a prism of an illumination optical system or a projection optical system such as an excimer laser lithography apparatus, a photo CVD apparatus and a laser processing apparatus whose light source whose wavelength is 250 nm or lower.

Figure 1:
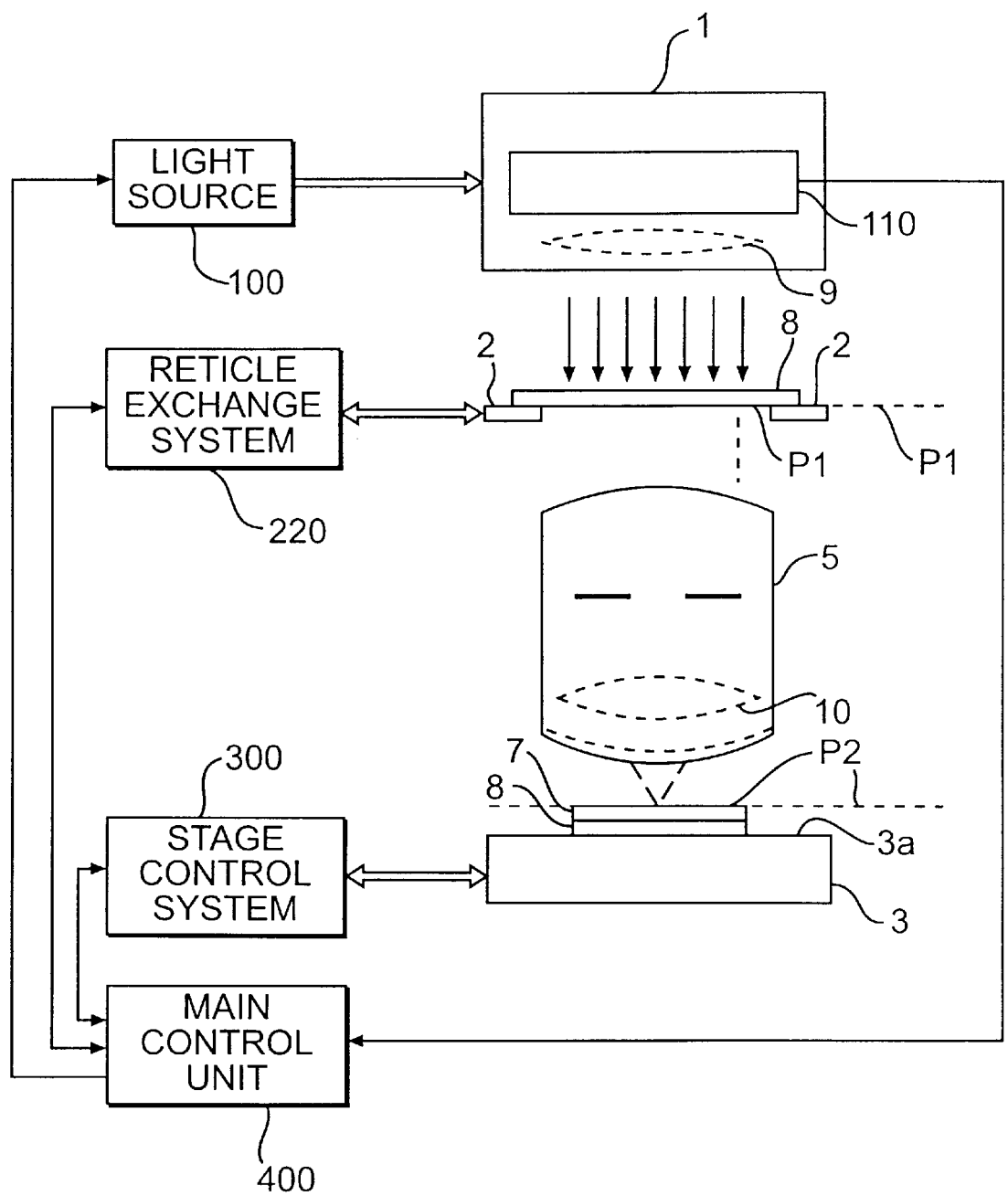
FIG. 1 is a schematic diagram depicting the basic structure of a typical exposure apparatus of the invention.

Preferably, the silica glasses are used in a projection exposure apparatus, such as a stepper, for projecting an image of patterns of reticle onto a wafer coated with a photoresist. FIG. 1 shows a basic structure of the exposure apparatus according to the invention. As shown in FIG. 1, an exposure apparatus of the invention comprises at least a wafer stage 3 allowing a photosensitive wafer W to be held on a main surface 3a; an illumination optical system 1 for emitting vacuum ultraviolet light of a predetermined wavelength as exposure light and transferring a predetermined pattern of a mask (reticle R) onto the wafer W; a light source 100 for supplying the exposure light to the illumination optical system 1; a projection optical system 5 provided between a first surface P1 (object plane) on which the mask R is disposed; and, a second surface P2 (image plane) which corresponds to a surface of the wafer W, for projecting an image of the pattern of the mask R onto the wafer W. The illumination optical system 1 includes an alignment optical system 110 for adjusting relative positions between the mask R and the wafer W. The mask R is disposed on a reticle stage 2 which is movable in parallel with respect to the main surface of the wafer stage 3. A reticle exchange system 200 conveys and changes a reticle, mask R, to be set on the reticle stage 2. The reticle exchange system 200 includes a stage driver for moving the reticle stage 2 in parallel with respect to the surface 3a of the wafer stage 3. The projection optical system 5 has an alignment optical system which is applied to a scanning type exposure apparatus.

The exposure apparatus of the invention contains an optical member which comprises the silica glasses of the invention, for example an optical lens of a silica glass made according to a method of the invention. More specifically, the exposure apparatus of the invention shown in FIG. 1 can include the optical lens of the invention as an optical lenses 9 and/or an optical lens 10 in the projection optical system 5.

The following examples illustrate the manufacture and use of fluorine-containing silica glasses according to the invention. The examples describe the manufacture of silica glasses which exhibit excellent durability against degradation by ultraviolet light and having virtually no decline in transmission rate when subjected to irradiation with high output excimer laser bean or ultraviolet light for long periods of time.

EXAMPLES 1–9

Figure 4:
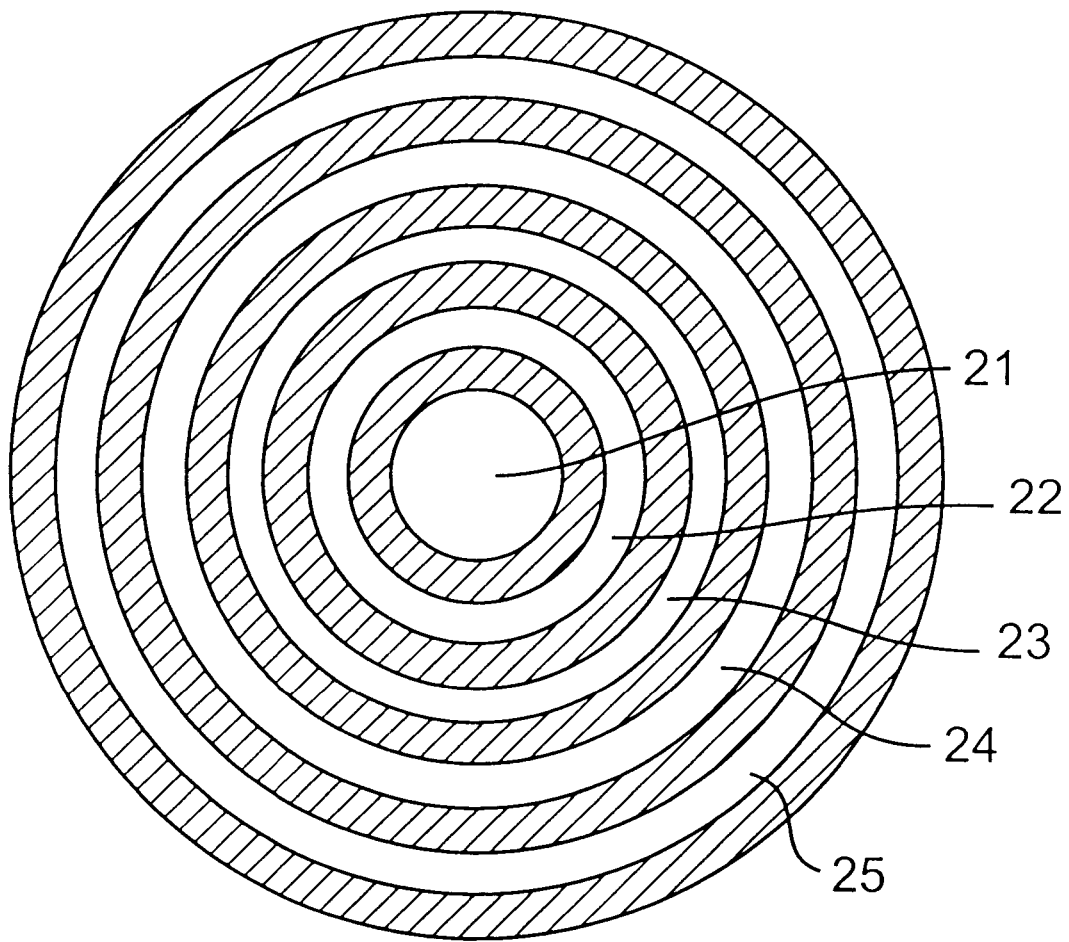
FIG. 4 is a cross section of the mouth of a suitable burner used for synthesis.

A silica glass synthesis furnace such as one described in FIG. 3 was used to perform synthesis while a heat resistant target was rotated and lowered with a similar velocity as the deposition speed. The furnace of FIG. 3 contains a target 11 upon which an ingot 17 is formed, a burner 12 for expelling the gases, a rotary shaft 13 which allows for the rotation of the target 11 and the X, Y, Z stage 16, an exhaustion opening 14 for the exhaust gases to flow through, and a refractory 15 which forms the interior of the furnace. The burner was of a 5-pipe structure as shown in FIG. 4 which depicts a circular pipe 21 surrounded by ring pipes 1 22, ring pipe 2 23, ring pipe 3 24 and ring pipe 4 25. Flow amount of oxygen, hydrogen and silicon compounds are shown in Table 1.

TABLE 1

| | | Circular Pipe | Ring Pipe 1 | Ring Pipe 2 | Ring Pipe 3 | Ring Pipe 4 | Oxygen: Hydrogen Ratio | $H_2$ (Molecule/ $Cm^3$) | OH (ppm) | F (ppm) | Transmittance | Solarization |
|---|---|---|---|---|---|---|---|---|---|---|---|---|
| Ex. 1 | $SiF_4$(slm) | 2.5 | 0 | 0 | 0 | 0 | 0.45 | 8.00E+17 | 830 | 1300 | ≧99.9 | None |
| | $SiCl_4$(g/min) | 0 | 0 | 0 | 0 | 0 | | | | | | |
| | $O_2$(slm) | 0.5 | 11.5 | 0 | 20 | 0 | | | | | | |
| | $H_2$(slm) | 0 | 0 | 26 | 0 | 45 | | | | | | |
| Ex. 2 | $SiF_4$(slm) | 3.5 | 0 | 0 | 0 | 0 | 0.45 | 7.00E+17 | 800 | 2500 | ≧99.9 | None |
| | $SiCl_4$(g/min) | 0 | 0 | 0 | 0 | 0 | | | | | | |
| | $O_2$(slm) | 0.5 | 11.5 | 0 | 20 | 0 | | | | | | |
| | $H_2$(slm) | 0 | 0 | 26 | 0 | 45 | | | | | | |
| Ex. 3 | $SiF_4$(slm) | 2.5 | 0 | 0 | 0 | 0 | 0.45 | 8.00E+17 | 830 | 1500 | ≧99.9 | None |
| | $SiCl_4$(g/min) | 1 | 0 | 0 | 0 | 0 | | | | | | |
| | $O_2$(slm) | 0.5 | 11.5 | 0 | 20 | 0 | | | | | | |
| | $H_2$(slm) | 0 | 0 | 26 | 0 | 45 | | | | | | |
| Ex. 4 | $SiF_4$(slm) | 3.5 | 0 | 0 | 0 | 0 | 0.45 | 8.00E+17 | 830 | 3500 | ≧99.9 | None |
| | $SiCl_4$(g/min) | 0.9 | 0 | 0 | 0 | 0 | | | | | | |
| | $O_2$(slm) | 0.5 | 11.5 | 0 | 20 | 0 | | | | | | |
| | $H_2$(slm) | 0 | 0 | 26 | 0 | 45 | | | | | | |
| Ex. 5 | $SF_6$(slm) | 0.5 | 2 | 0 | 0 | 0 | 0.45 | 1.00E+18 | 830 | 1200 | ≧99.9 | None |
| | $SiCl_4$(g/min) | 5 | 0 | 0 | 0 | 0 | | | | | | |
| | $O_2$(slm) | 0.5 | 11 | 0 | 22 | 0 | | | | | | |
| | $H_2$(slm) | 0 | 0 | 25 | 0 | 50 | | | | | | |
| Ex. 6 | $SF_6$(slm) | 2 | 8 | 0 | 0 | 0 | 0.45 | 6.00E+17 | 720 | 5000 | ≧99.9 | None |
| | $SiCl_4$(g/min) | 5 | 0 | 0 | 0 | 0 | | | | | | |
| | $O_2$(slm) | 0.5 | 11 | 0 | 22 | 0 | | | | | | |
| | $H_2$(slm) | 0 | 0 | 25 | 0 | 50 | | | | | | |
| Ex. 7 | $SF_6$(slm) | 1.5 | 0 | 0 | 0 | 0 | 0.68 | 5.00E+17 | 920 | 800 | ≧99.9 | None |
| | $SiCl_4$(g/min) | 5 | 0 | 0 | 0 | 0 | | | | | | |
| | $O_2$(slm) | 0.5 | 14 | 0 | 40 | 0 | | | | | | |
| | $H_2$(slm) | 0 | 0 | 20 | 0 | 60 | | | | | | |
| Ex. 8 | $SF_6$(slm) | 0.5 | 0 | 0 | 0 | 0 | 0.68 | 7.00E+17 | 980 | 900 | ≧99.9 | None |
| | $SiCl_4$(g/min) | 3 | 0 | 0 | 0 | 0 | | | | | | |

TABLE 1-continued

|  |  | Circular Pipe | Ring Pipe 1 | Ring Pipe 2 | Ring Pipe 3 | Ring Pipe 4 | Oxygen: Hydrogen Ratio | $H_2$ (Molecule/ $Cm^3$) | OH (ppm) | F (ppm) | Transmittance | Solarization |
|---|---|---|---|---|---|---|---|---|---|---|---|---|
| Ex. 9 | $O_2$(slm) | 0.5 | 14 | 0 | 40 | 0 | 0.29 | 1.00E+18 | 500 | 580 | ≧99.9 | None |
|  | $H_2$(slm) | 0 | 0 | 20 | 0 | 60 |  |  |  |  |  |  |
|  | $SF_6$(slm) | 0.5 | 0 | 0 | 0 | 0 |  |  |  |  |  |  |
|  | $SiCl_4$(g/min) | 3 | 0 | 0 | 0 | 0 |  |  |  |  |  |  |
|  | $C_2$(slm) | 0.5 | 7 | 0 | 16 | 0 |  |  |  |  |  |  |
|  | $H_2$(slm) | 0 | 0 | 20 | 0 | 60 |  |  |  |  |  |  |

A test piece of diameter 60 mm, and a thickness of 10 mm was cut out from the center of silica glass ingot having a diameter about 120 mm which was synthesized in a manner described above, and each of the fluorine, hydroxyl group and hydrogen molecule concentrations was measured.

Fluorine concentration and hydrogen concentration were measured using a Raman scattering spectrometer (Nippon Bunko K. K.: NR-1800). Fluorine concentration was obtained from the ratio of the Si—F Raman scattering intensity of 940 $cm^{-1}$ and Si—O Raman scattering intensity of 800 $cm^{-1}$. Hydrogen concentration was obtained from the ratio of Raman scattering intensity of 4135 $cm^{-1}$ and Raman scattering intensity of 800 $cm^{-1}$. Hydroxyl group concentration was obtained by measuring absorption of 2.73 μm using an infra-red spectrometer. Moreover, a test was conducted by irradiation of various excimer lasers (energy density 50–100 mJ/$cm^2$) to determine whether or not the silica glass was usable as optical device for ultraviolet lithography. As shown in Table 1, fluorine, hydroxyl group and hydrogen molecule co-exist in high concentration for each example. Measurement of the initial transmittance revealed that the transmission rate was 99.9% and above using an arbitrarily selected wavelength of 175 nm and above. Moreover, irradiation of the sample with 100 mJ/$cm^2$ p, 100 Hz, 1×$10^6$ pulse ArF excimer laser, which is a type of ultraviolet light pulse laser, did not result in decrease in transmittance.

EXAMPLE 10

Figure 6:
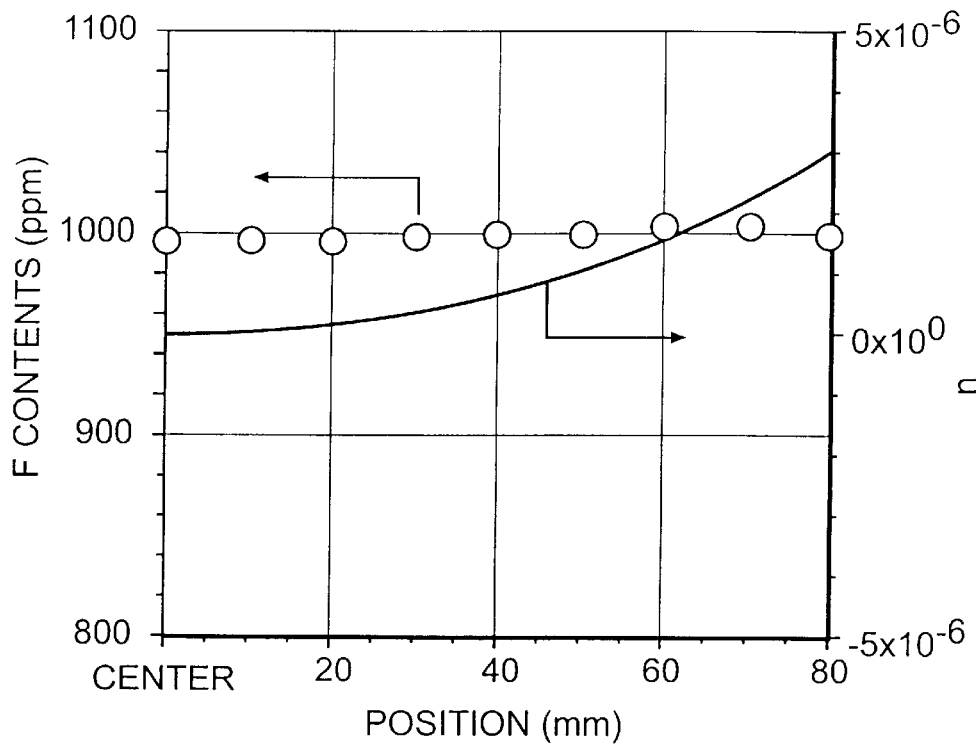
FIG. 6 is a graph depicting a fluorine concentration distribution and refractive index distribution obtained in Example 10.

Using a sealed synthetic furnace such as one depicted in FIG. 3, synthesis was performed under the synthesis conditions reported in Table 2, below. The target, while rotating, was lowered in Z-direction at the same speed as the growth speed of the ingot. Moreover, synthesis was performed while the center of the target was offset by 10 mm from the extension of the center line of the burner in X-direction by the XY stage and while the target was moved continuously in Y-direction with the movement width of ±40 mm and a period of 90 seconds, having a pattern shown in FIG. 5. From the center of the fluorine doped silica glass ingot of 200 mm diameter, a sample having a diameter of 160 mm was cut out in the radial direction from the center of the ingot, and the fluorine concentration distribution was measured using Raman scattering spectrometer. The ratio of 940 $cm^{-1}$ Si—F Raman scattering intensity and 800 $cm^{-1}$ Si—O Raman scattering intensity was used as a measurement method. Uniformity of the same sample was measured using Fizeau interferometer. As shown in FIG. 6, the maximum value and the minimum value of the fluorine concentration were 1007 ppm and 996 ppm respectively, and the difference between the maximum value and the minimum value was 11 ppm. An extremely high uniformity of $\Delta n$ (pv)=3×$10^{-6}$ was obtained.

TABLE 2

|  |  | Circular Pipe | Ring Pipe 1 | Ring Pipe 2 | Ring Pipe 3 | Ring Pipe 4 | Oxygen: Hydrogen Ratio | $H_2$ (Molecule/ $Cm^3$) | OH (ppm) | F (ppm) | Transmittance | Solarization |
|---|---|---|---|---|---|---|---|---|---|---|---|---|
| Ex. 10 | $SiF_4$(slm) | 3 | 0 | 0 | 0 | 0 | 0.44 | 8.00E+17 | 850 | 1000 | ≧99.9 | None |
|  | $SiCl_4$(g/min) | 5 | 0 | 0 | 0 | 0 |  |  |  |  |  |  |
|  | $O_2$(slm) | 0.5 | 26 | 0 | 66 | 0 |  |  |  |  |  |  |
|  | $H_2$(slm) | 0 | 0 | 60 | 0 | 150 |  |  |  |  |  |  |
| Ex. 11 | $SiF_4$(slm) | 3 | 0 | 0 | 0 | 0 | 0.44 | 7.00E+17 | 980 | 750 | ≧99.9 | None |
|  | $SiCl_4$(g/min) | 5 | 0 | 0 | 0 | 0 |  |  |  |  |  |  |
|  | $O_2$(slm) | 0.5 | 26 | 0 | 66 | 0 |  |  |  |  |  |  |
|  | $H_2$(slm) | 0 | 0 | 60 | 0 | 150 |  |  |  |  |  |  |
| Ex. 12 | $SiF_4$(slm) | 2.5 | 0 | 0 | 0 | 0 | 0.43 | 8.00E+17 | 840 | 1000 | ≧99.9 | None |
|  | $SiCl_4$(g/min) | 2 | 0 | 0 | 0 | 0 |  |  |  |  |  |  |
|  | $O_2$(slm) | 0.5 | 24 | 0 | 78 | 0 |  |  |  |  |  |  |
|  | $H_2$(slm) | 0 | 0 | 60 | 0 | 180 |  |  |  |  |  |  |
| Ex. 13 | $SiF_4$(slm) | 2.5 | 0 | 0 | 0 | 0 | 0.43 | 9.00E+17 | 950 | 830 | ≧99.9 | None |
|  | $SiCl_4$(g/min) | 2 | 0 | 0 | 0 | 0 |  |  |  |  |  |  |
|  | $O_2$(slm) | 0.5 | 24 | 0 | 78 | 0 |  |  |  |  |  |  |
|  | $H_2$(slm) | 0 | 0 | 60 | 0 | 180 |  |  |  |  |  |  |

EXAMPLE 11

Figure 7:
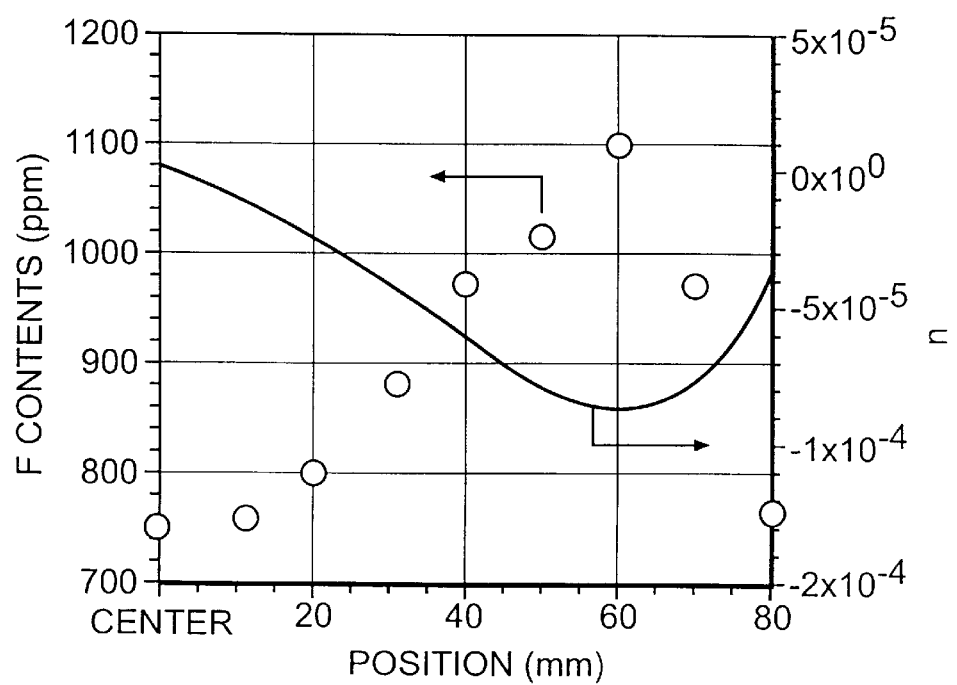
FIG. 7 is a graph depicting a fluorine concentration distribution and refractive index distribution obtained in Example 11.

A silica glass was formed using the same amount of gases as that used in Example 10. (See Table 2). The target was rotated and lowered in Z-direction but was not moved in XY plane. From the center of the fluorine doped silica glass ingot having a 200 mm diameter, a sample having a diameter of 160 mm was cut out in the radial direction from the center of the ingot. The fluorine concentration distribution was measured using Raman scattering spectrometer (Nippon Bunko K. K.: NR-1800). Uniformity of the sample was measured using Fizeau interferometer. As shown in FIG. 7, the difference between the maximum value (1102 ppm) and the minimum value (750 ppm) was 352 ppm, and the distribution of refractive index was extremely poor with ≲n (pv)=8.5×10$^{-5}$.

EXAMPLE 12

Figure 8:
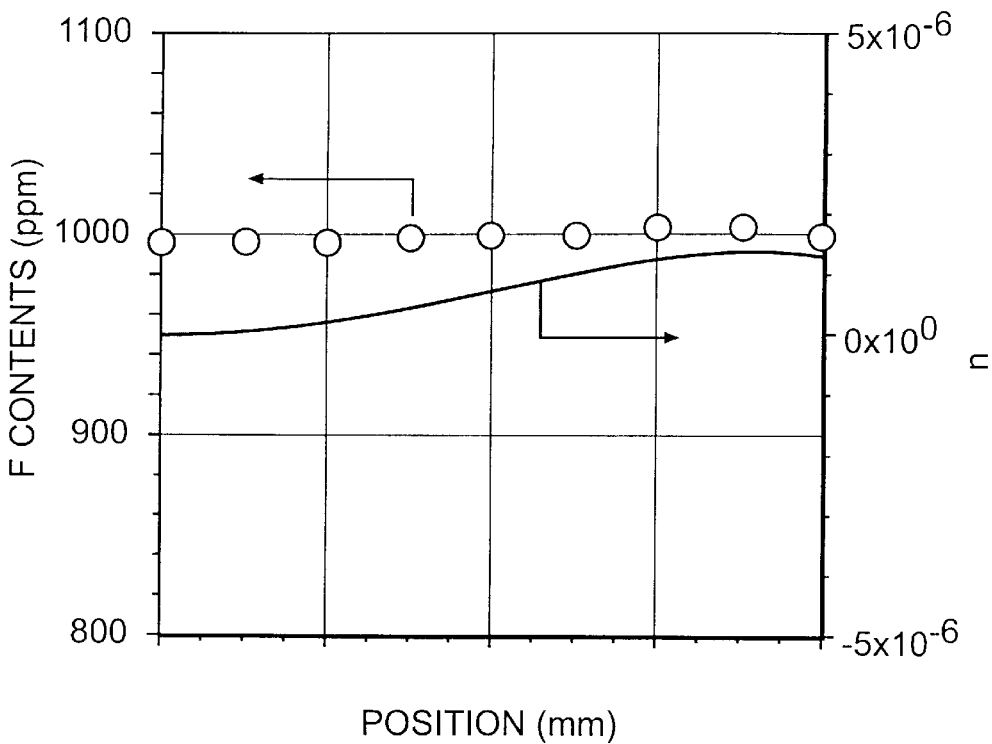
FIG. 8 is a graph depicting a fluorine concentration distribution and refractive index distribution obtained in Example 12.

Synthesis was performed using a sealed synthesis furnace such as one described in FIG. 3 and under the conditions listed in Table 2. The burner was arranged to have a 15° inclination. Synthesis was performed while moving the target continuously in Z-direction with a period of 90 seconds and with the width of ±20 mm from the reference position which is the intersection of extension of the central line of the burner and the center of the synthesis surface. The reference position was lowered at the same speed as the growth speed of the ingot. The target was rotated, but was fixed on the reference position in both the X-direction and in the Y-direction. From the center of the fluorine doped silica glass ingot having a diameter of 200 mm, a sample having a diameter of 160 mm was cut out in the radial direction from the center of the ingot, and the fluorine concentration distribution was measured using Raman scattering spectrometer. Uniformity of the same sample was measured using a Fizeau interferometer. As shown in FIG. 8, the maximum value and the minimum value of the fluorine concentration were 1003 ppm and 997 ppm respectively, and the difference between the maximum value and the minimum value was 6 ppm. An extremely high uniformity of ≲n (pv)=1.7×10$^{-6}$ was obtained.

EXAMPLE 13

Figure 9:
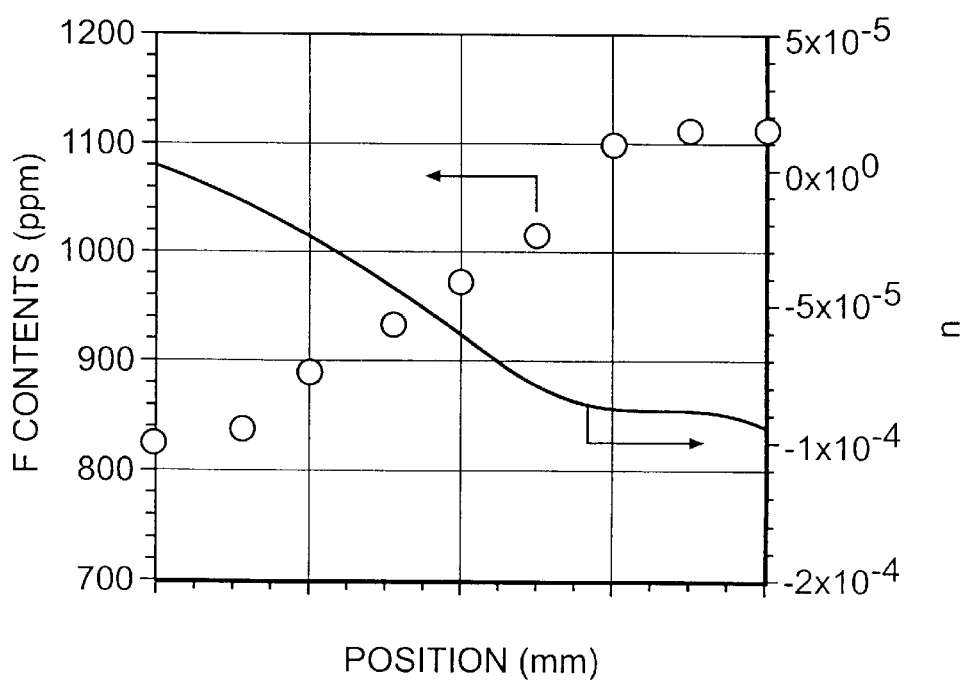
FIG. 9 is a graph depicting a fluorine concentration distribution and refractive index distribution obtained in Example 13.

A silica glass was formed using the same amount of gas as that used in Example 12. (See Table 2). The target was rotated and lowered in the Z-direction but was not moved in the XY plane. From the center of the fluorine doped silica glass ingot having a diameter of 200 m, a sample having a diameter of 160 mm was cut out in radial direction from the center of the ingot. The fluorine concentration distribution was measured using a Raman scattering spectrometer (Nippon Bunko K. K.: NR-1800). Uniformity of the same sample was measured using a Fizeau interferometer. As shown in FIG. 9, the difference between the maximum value (1112 ppm) and the minimum value (825 ppm) was 287 ppm, and the distribution of refractive index was extremely poor with ≲n (pv)=9.5×10$^{-5}$.

EXAMPLE 14

Lenses were produced using the silica glass of Examples 10 and 12. The lens was used for a projection system and an illumination system of the semiconductor exposure apparatus with a light source of ArF laser described in FIG. 1. The lens was found to satisfy the desired design characteristics. The lens had a resolution capability of about 0.18 μm line width. An integrated circuit pattern having sufficient flatness was obtained using the exposure apparatus comprising the lens. Moreover, both lenses of the invention which were used in the illumination optical system and the projection optical system were found to have about a 2.5 fold longevity compared to the conventional lenses.

The invention makes it possible to have hydrogen molecules, OH and F co-exist in a silica glass. The fluorine doped silica glass was highly resistant to degradation caused by ultraviolet light while allowing a high level of ultraviolet light transmission and a high degree of uniformity. Hence, a highly functional photolithography apparatus with long longevity which uses vacuum ultraviolet light can be obtained by the method of the invention.

EXAMPLES 15–16 and COMPARATIVE EXAMPLES 1–2

A silica ingot was synthesized by burning mixture of oxygen gas and hydrogen gas, in a burner of silica glass, in the presence of a high purity (99.9% or higher purity level, 10 ppb or less Fe concentration, 2 ppb or less Ni and Cr concentration for impure metal contents) silicon tetrafluoride gas and carrier gas (oxygen gas: flow amount 1.8 slm). The silicon tetrafluoride and the carrier gas were expelled from the central pipe of the burner. By combusting the oxygen and hydrogen gas, hydrolysis of the silicon-containing gas occurred, generating silica glass particles (soot). By rotating the soot with a speed of 7 revolutions per minute, and by depositing and melting the soot on a silica glass target plate having a diameter 200 mm which was being rocked with a period of 90 seconds and was lowered with a speed of 3.93 mm per hour for distance of 80 mm. The total hydrogen gas flow amount at this time was about 500 slm and the ratio of total oxygen gas flow amount and the hydrogen gas flow amount was set at $O_2/H_2$=0.4. The minimum distance from the refractory body to the deposition point in the synthesis furnace was set at 300 mm.

The deposition point was a position where the soot being expelled from the burner reaches the ingot surface. The refractory body was arranged such that the refractory body becomes an inner shape having length 600 mm×width 800 mm×height 800 mm which surrounds the silica glass ingot in the synthesis furnace. The refractory body was made of alumina ($Al_2O_3$) of 99% purity level. In this method, a silica glass ingot of diameter 300 mm and length 300 mm was obtained. The uniformity of refractive index of the silica glass ingot obtained was measured using a Fizeau interferometer whose light source was He—Ne laser beam. The silica glass ingot has high level of uniformity with the maximum refractive index difference of 2×10$^{-6}$ in the region of diameter 200 mm.

Four test pieces, each having a shape of 30×20 mm$^2$ and thickness 10 mm, were cut out from the location which was 100 mm away from the center in the radial direction of the silica glass ingot thus obtained. These test pieces were used for measuring the transmittance, for dehydration treatment and for ArF excimer laser irradiation.

Test pieces of 10×10×5 mm$^3$ for Cl, Na and K analysis were cut out from the location immediately below the location where the test piece for transmission rate was cut out. Measurements of Na and K were performed by radiation analysis using heat neutron ray irradiation. Samples for chemical element analysis for alkaline earth metals, transition metals and Al, and samples for F content measurement were cut out from the location which was adjacent to the location where test pieces for Cl, Na and K analysis were cut out. Measurement for all elements except for F was performed with an inductive coupling type plasma light emitting spectrum method. The measurement of F content was performed by ion chromatograph analysis after melting the sample with sodium carbonate to obtain a constant amount. Finally, the hydroxyl group concentration was determined by infrared absorption spectrum method which measures the absorption amount of 1.38 μm.

The concentration of each element, that is, of Mg and Ca in alkaline earth metals, and Sc, Ti, V, Cr, Mn, Fe, Co, Ni, Cu, Zn and Al of transition metals of the test piece in Example 15 was found to be 20 ppb or less. Moreover, Cl concentration was found to be less than the lower limit of detection (0.2 ppm), Na concentration was less than the lower limit of detection (1 ppb), and K concentration was less than the lower limit of detection (50 ppb). Moreover, F content was found to be 900 ppm, and OH group concentration was 950 ppm.

Next a process to remove hydrogen gas from the test pieces was performed by heating the test pieces to 700° C. for sixty hours (vacuum annealing) followed by cooling the four test pieces to room temperature in waterless (not containing OH group) silica glass tubal heat treatment furnaces having an inner diameter of 110 mm and the length 1000 mm. The hydrogen gas was removed in order to define the silica glasses durability, i.e, resistance to degradation, when exposed to light produced by a laser. Measurement of the hydrogen molecule concentration in the annealed silica glass was performed with a laser Raman spectrometer. The amount of hydrogen remaining in each of the test piece was found to be less than the detection limit ($1\times10^{16}$ molecules/$cm^3$). Moreover, the 606 $cm^{-1}$ Raman line intensity was not changed as a result of the treatment to remove hydrogen gas. It was believed that the silica glass structure did not change as a result of the above treatment.

Next, a process to change the structure determination temperature for each of four test pieces obtained thus far was conducted. Each test piece was placed in the center of the waterless silica glass tubal furnaces which had an inner diameter of 40 mm and length of 300 mm. The test pieces were kept at respective temperatures of 1073, 1183, 1273 and 1373 K. Total durations of time during which the test pieces were kept at respective temperature were 240, 100, 24 and 20 hours respectively. The test pieces were then introduced to a Dewar containing liquid nitrogen for 0.2 second or less. The test pieces were labeled Examples 15–16 and Comparative Examples 1–2. Measurements on these test pieces for 606 $cm^{-1}$ Raman line intensity revealed that the intensity was proportional to the temperature at which the test pieces were kept. Hence, the structure determination temperatures of the test pieces were determined to be 1073, 1183, 1273 and 1373 K. respectively.

Next, each test piece was ground precisely so that the degree of parallelization between two facing planes was 10 seconds or less, flatness of each plane was 3 or less newton rings, coarseness of each surface, rms was 10 angstrom or less with a final thickness of 10±0.1 mm. Finally, the test piece was polished with highly pure $SiO_2$ powder to remove any grinding agent from the surface.

The inner transmittance of the test pieces was evaluated by a spectrometer which was adjusted using the method disclosed in Japanese Laid-Open Patent Publication 5-211217, which is herein incorporated by reference in its entirety. The test pieces exhibited an inner absorption coefficient at wavelength 193 nm of 0.01 $cm^{-1}$ or less for each of the test pieces of the Examples 15–16 and Comparative Examples 1–2 which was excellent value of 99.9% or better per 1 cm when converted in terms of inner transmittance. Here, the absorption coefficient was computed using the following equation:

Absorption coefficient=−1 $n$ (transmittance/theoretical transmittance)/(test piece thickness)

where, the theoretical transmittance refers to a transmittance which was determined only by reflection loss of the sample surface having zero inner absorption loss.

Figure 10:
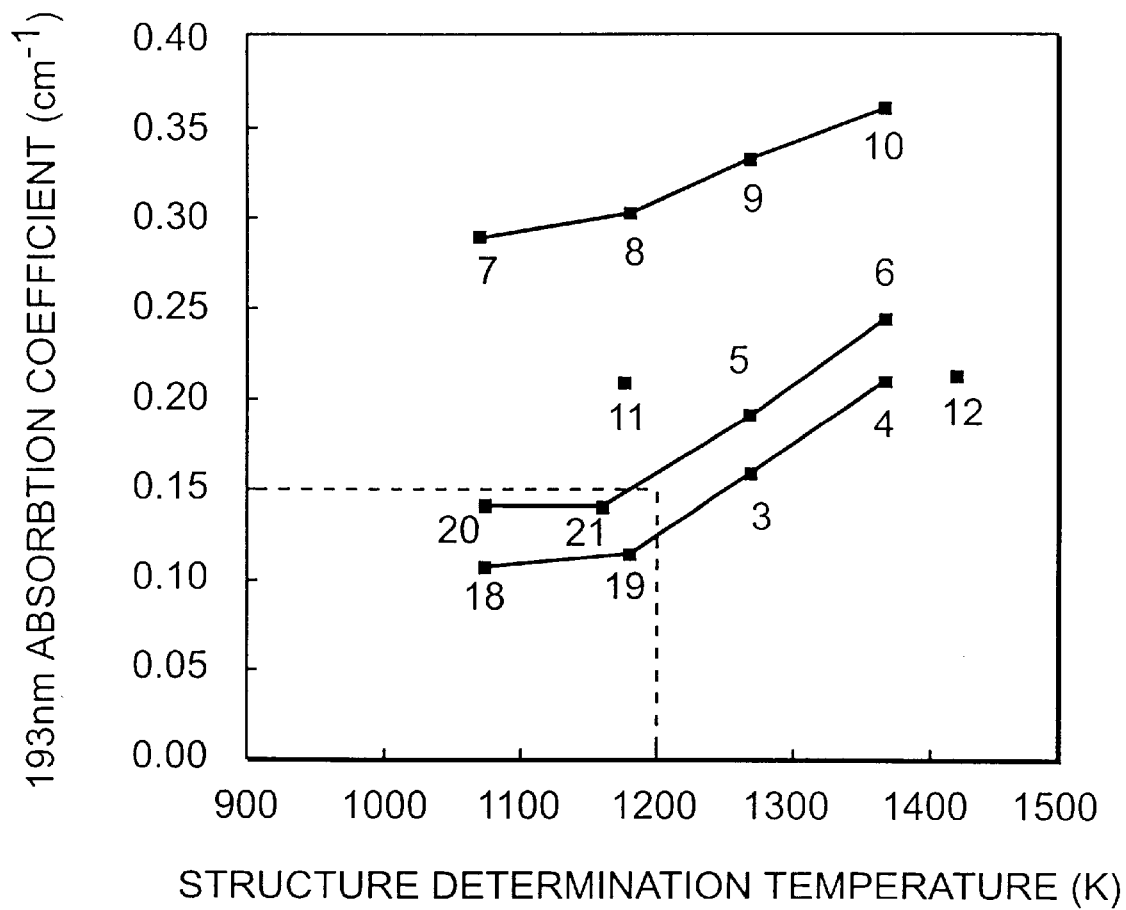
FIG. 10 is a graph depicting the correlation between the structure determination temperature and the absorption amount produced by ArF excimer laser irradiation.
Figure 11:
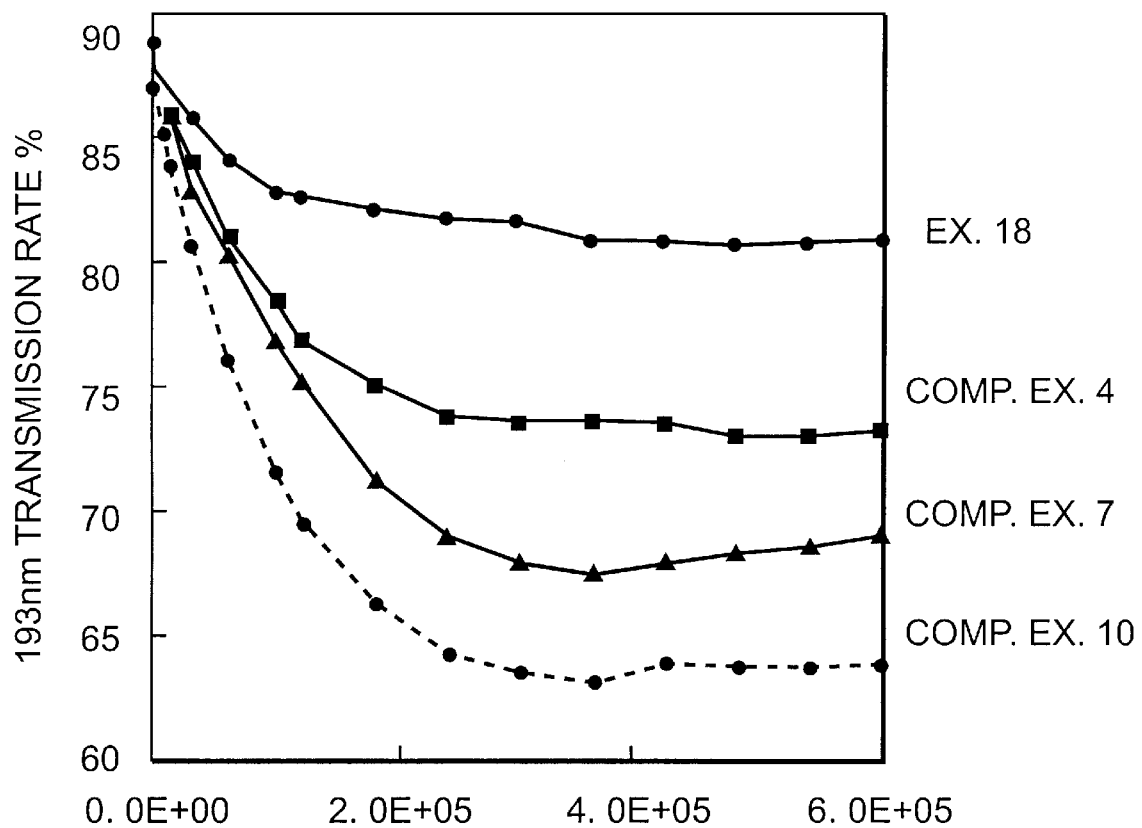
FIG. 11 is a graph depicting the change of 193 mn transmittance caused by ArF excimer irradiation.

The test pieces were subjected to an irradiation test with ArF excimer laser beam of one pulse energy density: 200 mJ/$cm^2$ and repetition: 100 Hz. FIG. 11 describes 193 nm transmittance change as a result of irradiation for Example 15 and Comparative Example 1 test pieces. The transmittance drops right after the start of irradiation as described in FIG. 11, but it saturates at certain pulse number, beyond which the transmittance does not drop. Absorption coefficient at the minimum value of the transmittance caused by drop in irradiation was computed from the aforementioned equation and was graphed against the structure determination temperature, which is shown in FIG. 10. It was verified that the 193 nm absorption amount of Examples 15–16 were smaller than that of Comparative Examples 1–2 and that the resistance to ultraviolet light degradation was superior. The result is compiled in Table 3.

TABLE 3

| | Ts (k) | Cl (ppm) | OH (ppm) | F (ppm) | $H_2$ ($cm^{-3}$) | Absorption Coefficient ($cm^{-1}$) |
|---|---|---|---|---|---|---|
| Ex. 15 | 1073 | <0.02 | 950 | 900 | <1E+16 | 0.11 |
| Ex. 16 | 1183 | <0.2 | 950 | 900 | <1E+16 | 0.11 |
| Comp. Ex. 1 | 1273 | <0.2 | 950 | 900 | <1E+16 | 0.16 |
| Comp. Ex. 2 | 1373 | <0.2 | 950 | 900 | <1E+16 | 0.21 |
| Ex. 17 | 1073 | <0.2 | 650 | <50 | <1E+16 | 0.14 |
| Ex. 18 | 1164 | <0.2 | 650 | <50 | <1E+16 | 0.14 |
| Comp. Ex. 3 | 1273 | <0.2 | 650 | <50 | <1E+16 | 0.19 |
| Comp. Ex. 4 | 1373 | <0.2 | 650 | <50 | <1E+16 | 0.25 |
| Comp. Ex. 5 | 1073 | 50 | 950 | <50 | <1E+16 | 0.29 |
| Comp. Ex. 6 | 1183 | 50 | 950 | <50 | <1E+16 | 0.30 |
| Comp. Ex. 7 | 1273 | 50 | 950 | <50 | <1E+16 | 0.34 |
| Comp. Ex. 8 | 1373 | 50 | 950 | <50 | <1E+16 | 0.36 |

EXAMPLES 17–18 and COMPARATIVE EXAMPLES 3–4

The same conditions as Example 18 were used except for use of methyltrimethoxysilane ($Si(CH_3)(OCH_3)_3$) as the silicon-containing gas (flow amount 20 g/min, carrier gas He 5 slm). Through this method, a silica glass ingot of diameter 150 mm and length 300 mm was obtained. Test pieces were cut out and heat treated in the same manner as Example 15. The structure determination temperatures of test pieces are shown in Table 3. The ArF excimer laser irradiation test of Example 15 was conducted for the silica glasses of Examples 17–18 with the results summarized in Table 3 and FIG. 10. As described in FIG. 10, the 193 nm absorption amount of Examples 17–18 was smaller than Comparative Examples 5–6, confirming the superiority of the silica glasses ability to resist ArF excimer laser ultraviolet light degradation. The results are summarized in Table 3.

COMPARATIVE EXAMPLES 5–8

The same synthesis conditions as Example 15 was repeated except for use of silicon tetrachloride as the silicon-containing gas (flow amount 30 g/min, carrier gas oxygen 1.8 slm). Through this method, a silica glass ingot of diameter 300 mm and length 300 mm was obtained. Test pieces were cut out and heat treated in the same manner as Example 15. The structure determination temperatures of test pieces thus obtained are shown in Table 3. The ArF excimer laser irradiation test was conducted as set forth in Example 15. The results are summarized in Table 3 and FIG. 11. As described in FIG. 10, the absorption amounts due to irradiation of Comparative Examples 5–8 were substantial. It was determined that the absorption amount may be reduced by lowering the structure determination temperature, but the effect was small when compared to Example 15.

EXAMPLE 19 and COMPARATIVE EXAMPLE 9

The test piece of Example 19 was manufactured using the same method as described in Examples 15–16. The difference from Examples 15–16 was that the use of a rapid cooling treatment was not performed but rather a heat treatment as described below was performed on the silica glass ingot. A sample of diameter 250 mm and thickness 50 mm was cut out from the ingot, The sample was maintained under at atmospheric pressure with a 1000° C. temperature for 10 hours. The sample was then cooled gradually to 500° with the temperature decreasing speed of 10° C./hour, which was then left to be cooled further. A test piece of diameter 60 mm and thickness 10 mm was cut out from the sample after heat treatment, for which same optical polishing was performed as in Example 15 and was made to be Example 19.

Next, a sample of diameter 60 mm and the thickness 10 mm was cut out from the silica glass ingot described above, for which a rapid cooling treatment was performed under the same conditions as Comparative Example 2 except for maintenance time was one hour. This test piece was made to be Comparative Example 9.

The structure determination temperature (Ts), F content, OH content, Cl content and hydrogen molecule content were measured for the test pieces of Example 19 and Comparative Example 9. The results for Example 19 were Ts=1183 K., F=900 ppm, OH=950 ppm, Cl$\leq$0.2 ppm, $H_2$=2.1×10$^{18}$ cm$^{-4}$.

The test pieces of Example 19 and Comparative Example 9 were 2×10$^7$ pulse irradiated with an ArF excimer laser having one pulse energy density: 200 mJ/cm$^2$/pulse, repetition: 100 Hz. As a result, 193 nm absorption amount were determined to be 0.06 cm$^{-1}$ and 0.12 cm$^{-1}$, respectively, which verifies the superiority of Example 19.

The invention provides an optical device such as a silica glass optical member, a fiber, a window member, a mirror, an etalon and a prism which have high throughput for ultraviolet light, vacuum ultraviolet light of wavelength no more than 250 nm and laser beam in the same wavelength region. The invention provides an optical system capable of providing uniform imaging over a wide area by improving the throughput of ultraviolet light, vacuum ultraviolet light of wavelength no more than 250 nm and laser beams in the same wavelength region. Moreover, the invention enables photolithographic manufacturing having a high degree of precision when using a light source of wavelength no more than 250 nm.

EXAMPLE 20

Silicon tetrachloride was subjected to hydrolysis and simultaneous vitrification in an oxygen-hydrogen flame under the conditions shown below using a burner with a quintuple tube structure.

Silicon tetrachloride  15 g/min + sulfur hexafluoride carrier 1 slm
Second tube oxygen  5 slm
Third tube hydrogen  10 slm
Fourth tube oxygen  15 slm
Fifth tube hydrogen  40 slm Hydrolysis for 20 hours under these conditions produced a fluorine-doped silica glass with a diameter of 90 mm. When the transmittance of this sample at 193 nm was measured, a value exceeding 99.9% was obtained. When the sulfur and fluorine concentrations in this sample were determined by means of an ion chromatograph, the sulfur concentration was 10 ppm, and the fluorine concentration was 1500 ppm (weight ratio: 150).

COMPARATIVE EXAMPLE 10

Silicon tetrachloride was subjected to hydrolysis and simultaneous vitrification in an oxygen-hydrogen flame under the conditions shown below using a burner with a quintuple tube structure.

Silicon tetrachloride  15 g/min + sulfur hexafluoride carrier 1.5 slm
Second tube oxygen  5 slm
Third tube hydrogen  10 slm
Fourth tube oxygen  15 slm
Fifth tube hydrogen  40 slm Hydrolysis for 20 hours under these conditions produced a fluorine-doped quartz glass with a diameter of 90 mm. When the transmittance of this sample at 193 nm was measured, a value of 97.2% was obtained. When the sulfur and fluorine concentrations in this sample were determined by means of an ion chromatograph, the sulfur concentration was 40 ppm, and the fluorine concentration was 1800 ppm (weight ratio: 45).

EXAMPLE 21

Silicon tetrachloride was subjected to hydrolysis and simultaneous vitrification in an oxygen-hydrogen flame under the conditions shown below using a burner with a quintuple tube structure.

| | |
|---|---|
| Silicon tetrachloride | 1.32 slm + sulfur hexafluoride carrier 1 slm |
| Second tube oxygen | 5 slm |
| Third tube hydrogen | 10 slm |
| Fourth tube oxygen | 15 slm |
| Fifth tube hydrogen | 40 slm |

Hydrolysis for 20 hours under these conditions produced a fluorine-doped silica glass with a diameter of 90 mm. When the transmittance of this sample at 193 nm was measured, a value exceeding 99.9% was obtained. When the sulfur and fluorine concentrations in this sample were determined by means of an ion chromatograph, the sulfur concentration was 20 ppm, and the fluorine concentration was 3700 ppm (weight ratio: 185).

COMPARATIVE EXAMPLE 11

Silicon tetrachloride was subjected to hydrolysis and simultaneous vitrification in an oxygen-hydrogen flame under the conditions shown below using a burner with a quintuple tube structure.

| | |
|---|---|
| Silicon tetrachloride | 1.32 slm + sulfur hexafluoride carrier 1.5 slm |
| Second tube oxygen | 5 slm |
| Third tube hydrogen | 10 slm |
| Fourth tube oxygen | 15 slm |
| Fifth tube hydrogen | 40 slm |

Hydrolysis for 20 hours under these conditions produced a fluorine-doped silica glass with a diameter of 90 mm. When the transmittance of this sample at 193 nm was measured, a value of 97.0% was obtained. When the sulfur and fluorine concentrations in this sample were determined by means of an ion chromatograph, the sulfur concentration was 30 ppm, and the fluorine concentration was 2500 ppm (weight ratio: 83).

What is claimed is:

1. A fluorine-containing silica glass comprising:

a silica glass having a hydrogen molecule concentration ranging from about $2 \times 10^{17}$ to $5 \times 10^{18}$ molecules/cm$^3$ and a hydroxyl group concentration ranging from about 600 ppm to 1300 ppm.

2. A fluorine-containing silica glass of claim 1, wherein the silica glass has a weight ratio of fluorine to sulfur of no less than 100.

3. A fluorine-containing silica glass of claim 1, wherein the silica glass has a transmittance of 99.9% or higher for ultraviolet light of wavelength 193 nm.

4. A fluorine-containing silica glass of claim 1, wherein the fluorine concentration contained in the silica glass is no less than 100 ppm.

5. A fluorine-containing silica glass of claim 1, wherein the silica glass is substantially free of chlorine and has a structure determination temperature ranging from 900 K. to 1200 K.

6. A fluorine-containing silica glass of claim 1, wherein the fluorine concentration ranges from 10 to 1000 ppm.

7. A fluorine-containing silica glass comprising:

silica glass which is substantially free of chlorine and has a structure determination temperature ranging from 900 K. to 1200 K., a fluorine concentration ranging from 10 to 1000 ppm, a hydroxyl group concentration ranging from 600 to 1300 ppm and a hydrogen molecule concentration ranging from $2 \times 10^{17}$ to $5 \times 10^{18}$ molecules/cm$^3$.

\* \* \* \* \*

UNITED STATES PATENT AND TRADEMARK OFFICE
CERTIFICATE OF CORRECTION

PATENT NO. : 5,958,809
DATED : September 28, 1999
INVENTOR(S) : Seishi FUJIWARA et al.

It is certified that error appears in the above-identified patent and that said Letters Patent is hereby corrected as shown below:

Title page, [30] Foreign Application Priority Data, line 3, please delete "8-881254" and insert therefor --8-221254--.

Signed and Sealed this

Twenty-seventh Day of June, 2000

Attest:

Attesting Officer

Q. TODD DICKINSON

Director of Patents and Trademarks